US012772683B2

(12) United States Patent
Lee et al.

(10) Patent No.: US 12,772,683 B2
(45) Date of Patent: Oct. 20, 2026

(54) DISPLAY DEVICE AND DISPLAY PANEL

(71) Applicant: LG Display Co., Ltd., Seoul (KR)

(72) Inventors: Seunghyun Lee, Goyang-si (KR); Hoyoung Lee, Paju-si (KR); Juhnsuk Yoo, Seoul (KR); Sungjin Park, Paju-si (KR)

(73) Assignee: LG Display Co., Ltd., Seoul (KR)

(*) Notice: Subject to any disclaimer, the term of this patent is extended or adjusted under 35 U.S.C. 154(b) by 450 days.

(21) Appl. No.: 18/481,821

(22) Filed: Oct. 5, 2023

(65) Prior Publication Data

US 2024/0130185 A1 Apr. 18, 2024

(30) Foreign Application Priority Data

Oct. 18, 2022 (KR) ........................ 10-2022-0134012

(51) Int. Cl.
*H10K 59/131* (2023.01)

(52) U.S. Cl.
CPC .................................. *H10K 59/131* (2023.02)

(58) Field of Classification Search
CPC .................................................... H10K 59/131
See application file for complete search history.

(56) References Cited

U.S. PATENT DOCUMENTS

2022/0037444 A1 2/2022 Sun
2022/0246710 A1* 8/2022 Woo .................. H10K 59/1213

FOREIGN PATENT DOCUMENTS

KR 20170113066 A 10/2017
KR 20200097371 A 8/2020
KR 20210075549 * 6/2021
KR 20210103632 A 8/2021
KR 20220007009 A 1/2022
KR 20220073115 A 6/2022
KR 20220111767 A 8/2022

* cited by examiner

*Primary Examiner* — Matthew L Reames
(74) *Attorney, Agent, or Firm* — Seed Intellectual Property Law Group LLP

(57) ABSTRACT

The present disclosure provides a display panel and a display device including a display area and a non-display area. The display area includes light emitting areas and signal lines, an optical area, and a normal area outside the optical area. The normal area includes a non-transmission area including light emitting areas, and the optical area includes a transmission area and a non-transmission area including light emitting areas. At least one first type signal line extending through the optical area among the signal lines includes a transparent line part in the transmission area of the optical area and a non-transparent line part in the non-transmission area of the optical area. The transparent and non-transparent line parts are in different layers. Through the foregoing configuration, the transmittance of the first optical area with which a first optical electronic device is overlapped can be improved.

26 Claims, 17 Drawing Sheets

1020

DISPLAY DEVICE AND DISPLAY PANEL

CROSS-REFERENCE TO RELATED APPLICATION

This application claims the priority benefit of Republic of Korea Patent Application No. 10-2022-0134012, filed on Oct. 18, 2022 in the Korean Intellectual Property Office, which is incorporated herein by reference in its entirety.

TECHNICAL FIELD

The present disclosure relates to electronic devices, and more particularly, to a display device and a display panel including one or more optical electronic devices not exposed on front surfaces thereof.

DESCRIPTION OF THE RELATED ART

As display technology advances, display devices can provide increased functions, such as an image capture function, a sensing function, and the like, as well as an image display function. To provide these functions, a display device may need to include one or more optical electronic devices, such as a camera, a sensor for detecting an image, and the like.

In order to receive light passing through a front surface of a display device, it may be desirable for such an optical electronic device to be located in an area of the display device where incident light coming from the front surface can be increasingly received and detected. To achieve the foregoing, in a typical display device, an optical electronic device has been designed to be located in a front portion of the display device to allow a camera, a sensor, and/or the like as the optical electronic device to be increasingly exposed to incident light. In order to install an optical electronic device in a display device in this manner, a bezel area of the display device may be increased, or a notch or a hole may be needed to be formed in a display area of an associated display panel.

Therefore, any display device that has an optical electronic device to receive or detect incident light, and perform an intended function, will have a design to accommodate the optical device.

BRIEF SUMMARY

The inventors have developed techniques for providing or placing at least one optical electronic device in a display device without reducing an area of a display area of a display panel of the display device. Through the development, the inventors have invented a display panel and a display device that have a light transmission structure in which even when at least one optical electronic device is located under a display area of the display panel and is therefore not exposed in a front surface of the display device, the optical electronic device can receive light normally and increasingly.

One or more embodiments of the present disclosure can provide a display panel and a display device that include a light transmission structure for enabling at least one optical electronic device to normally receive light (e.g., visible light, infrared light, ultraviolet light, or the like) while not being exposed in a front surface of the display device.

One or more embodiments of the present disclosure can provide a display panel and a display device that include a signal line arrangement capable of increasing the transmittance of at least one optical area.

One or more embodiments of the present disclosure can provide a display panel and a display device that is capable of preventing decrease of transmittance and performance of at least one optical electronic device due to at least one signal line extending across at least one optical area.

One or more embodiments of the present disclosure can provide a display panel and a display device that is capable of providing high transmittance and high image quality in at least one optical area.

According to aspects of the present disclosure, a display device can be provided that includes a display area allowing one or more images to be displayed therein and including a plurality of light emitting areas and a plurality of signal lines, and a non-display area in which an image is not displayed.

The display area may include a first optical area and a normal area located outside of the first optical area.

The normal area may include a non-transmission area including a plurality of light emitting areas.

The first optical area may include a non-transmission area including a plurality of light emitting areas and may further include at least one transmission area.

The plurality of signal lines may include a plurality of first type signal lines extending across the first optical area.

At least one of the plurality of first type signal lines may include at least one transparent line part disposed in the transmission area of the first optical area and at least one non-transparent line part disposed in the non-transmission area of the first optical area.

The transparent line part and the non-transparent line part may be located in different layers.

The display device may further include an insulating layer located between the transparent line part and the non-transparent line part, and a connection pattern for electrically connecting the transparent line part to the non-transparent line part through a hole formed in the insulating layer.

The first type signal line may be bent or curved at a predefined angle or direction at a boundary (or an area around the boundary) between the transmission area and the non-transmission area of the first optical area.

The plurality of first type signal lines may include at least one first gate line and at least one first data line.

The first gate line may include a first transparent gate line part disposed in the transmission area and a first non-transparent gate line part disposed in the non-transmission area.

The first transparent gate line part and the first non-transparent gate line part may be electrically connected to each other.

The first data line may include a first transparent data line part disposed in the transmission area and a first non-transparent data line part disposed in the non-transmission area.

The first transparent data line part and the first non-transparent data line part may be electrically connected to each other.

The first non-transparent gate line part may include a first gate metal.

The first transparent gate line part may include a first transparent conductive material.

The first non-transparent data line part may include a first source-drain metal.

The first transparent data line part may include a second transparent conductive material.

The plurality of first type signal lines may include another gate line different from the first gate line and another data line different from the first data line.

The another data line may include a transparent data line part overlapping the first transparent gate line part of the first gate line.

The another gate line may include a transparent gate line part overlapping the first transparent data line part of the first data line.

The plurality of signal lines may comprise a plurality of second type signal lines disposed only in the normal area without extending across the first optical area.

Each of the plurality of second type signal lines may include a metal in at least one non-transparent line part included in the plurality of first type signal lines.

The display device may further include a first gate metal layer including the first gate metal, a first source-drain metal layer including the first source-drain metal, a first transparent conductive material layer including the first transparent conductive material, a second source-drain metal layer including a second source-drain metal, and a second transparent conductive material layer including the second transparent conductive material.

The display device may further include a substrate, a first buffer layer on the substrate, a first gate insulating layer on the first buffer layer, a first interlayer insulating layer on the first gate insulating layer, a second buffer layer on the first interlayer insulating layer, a second gate insulating layer on the second buffer layer, a second interlayer insulating layer on the second gate insulating layer, a first planarization layer on the second interlayer insulating layer, and a second planarization layer on the first planarization layer.

The first gate metal layer may be located between the first gate insulating layer and the first interlayer insulating layer. The first source-drain metal layer may be located between the second interlayer insulating layer and the first planarization layer. The first transparent conductive material layer may be located between the first source-drain metal layer and the first planarization layer. The second source-drain metal layer may be located between the first planarization layer and the second planarization layer. The second transparent conductive material layer may be located between the second source-drain metal layer and the second planarization layer.

The display device may further include a first gate connection pattern for electrically connecting the first transparent gate line part to the first non-transparent gate line part.

The first gate connection pattern may be disposed on the second interlayer insulating layer and may include the first source-drain metal.

The first gate connection pattern can electrically connect the first transparent gate line part to the first non-transparent gate line part through holes formed in the second interlayer insulating layer, the second gate insulating layer, the second buffer layer, and the first interlayer insulating layer.

The display device may further include a first data connection pattern for electrically connecting the first transparent data line part to the first non-transparent data line part.

The first data connection pattern may be disposed on the first planarization layer and may include the second source-drain metal.

The first data connection pattern can electrically connect the first transparent data line part to the first non-transparent data line part through a hole formed in the first planarization layer.

The display device may further include a cathode electrode disposed in the first optical area and located on a plurality of first type signal lines.

The cathode electrode may include a plurality of cathode holes located in the first optical area.

Each of the plurality of cathode holes may overlap all or a respective portion of one or more transparent line parts.

The display area may further include a second optical area. The second optical area may include a non-transmission area including a plurality of light emitting areas and may further include at least one transmission area.

The display device may further include a first optical electronic device overlapping the first optical area and a second optical electronic device overlapping the second optical area.

For example, one of the first optical electronic device and the second optical electronic device may be a camera, and the other thereof may be a sensor different from the camera.

According to aspects of the present disclosure, a display panel can be provided that includes a display area allowing one or more images to be displayed therein and including a plurality of light emitting areas and a plurality of signal lines, a non-display area in which an image is not displayed, and a cathode electrode disposed to be overlapped with the display area.

The display area may include a first optical area and a normal area located outside of the first optical area.

The normal area may include a non-transmission area including a plurality of light emitting areas.

The first optical area may include a non-transmission area including a plurality of light emitting areas and may further include at least one transmission area.

The cathode electrode may include a plurality of cathode holes located in the first optical area.

At least one first type signal line extending across the first optical area among the plurality of signal lines may include a non-transparent line part and a transparent line part.

All or a respective portion of one or more transparent line parts may overlap at least one cathode hole of the cathode electrode.

All or a portion of the first optical area can be configured to allow one or more of visible light, infrared light, and ultraviolet light to transmit.

According to one or more embodiments of the present disclosure, a display panel and a display device can be provided that include a light transmission structure for enabling one or more optical electronic devices to normally receive light (e.g., visible light, infrared light, ultraviolet light, or the like) while not being exposed in a front surface of the display device.

According to one or more embodiments of the present disclosure, a display panel and a display device can be provided that include a signal line arrangement capable of improving the transmittance of at least one optical area by designing at least one signal line extending across the optical area to have at least one transparent portion in at least one transmission area of the optical area.

According to the embodiments described herein, a display panel (e.g., the display panel 110) and a display device (e.g., the display device 100) can be provided that are capable of reducing the size of a non-transmission area in at least one optical area, further increasing the transmittance of the optical area, and thereby improving the performance of at least one optical electronic device (e.g., a camera, a sensor, and the like) overlapping the at least one optical area by disposing at least one signal line extending across the optical area to overlap at least one transmission area of the optical area.

According to one or more embodiments of the present disclosure, a display panel and a display device can be provided that are capable of providing high transmittance and high image quality in at least one optical area overlapping at least one optical electronic device within a display area.

Additional features and aspects will be set forth in part in the description which follows and in part will become apparent from the description or may be learned by practice of the inventive concepts provided herein. Other features and aspects of the inventive concepts may be realized and attained by the structure particularly pointed out in, or derivable from, the written description, the claims hereof, and the appended drawings. Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims. It is to be understood that both the foregoing general description and the following detailed description of the present disclosure are exemplary and explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1A:
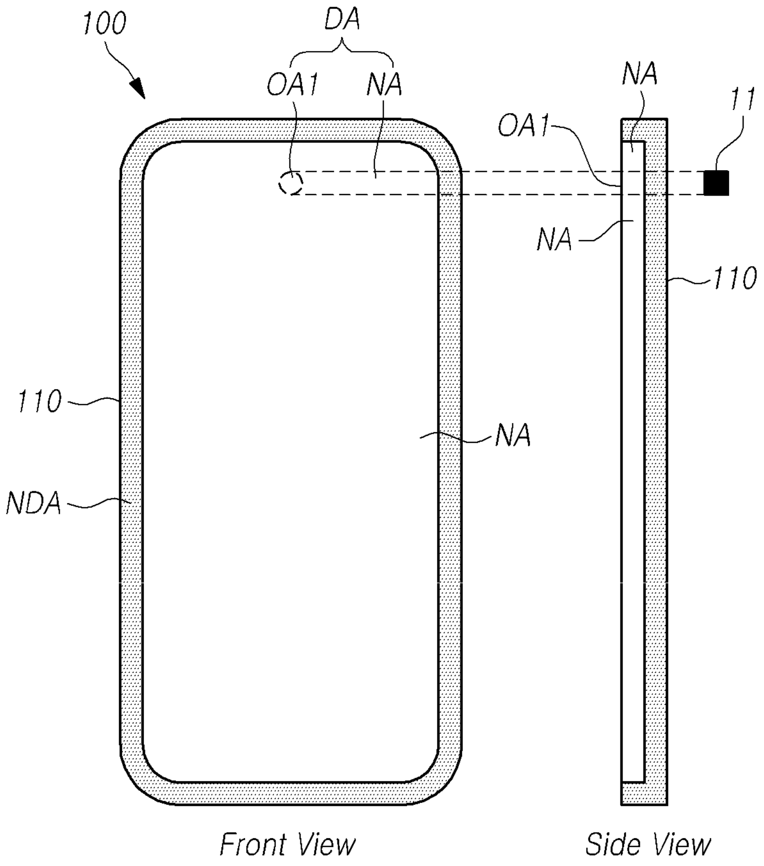
FIGS. 1A, 1B, and 1C illustrate an example display device according to aspects of the present disclosure.

Reference will now be made in detail to embodiments of the present disclosure, examples of which may be illustrated in the accompanying drawings. In the following description, structures, embodiments, implementations, methods and operations described herein are not limited to the specific example or examples set forth herein and may be changed as is known in the art, unless otherwise specified. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

Shapes, sizes, ratios, angles, numbers, and the like, which are illustrated in the drawings to describe various example embodiments of the present disclosure are merely given by way of example. Therefore, the present disclosure is not limited to the illustrations in the drawings. Like reference numerals designate like elements throughout, unless otherwise specified. Names of the respective elements used in the following explanations are selected only for convenience of writing the specification and may thus be different from those used in actual products. In the following description, where the detailed description of the relevant known function or configuration may unnecessarily obscure aspects of the present disclosure, a detailed description of such known function or configuration may be omitted. Where the terms “comprise,” “have,” “include,” “contain,” “constitute,” “make up of,” “formed of,” and the like are used, one or more other elements may be added unless the term, such as “only,” is used. An element described in the singular form is intended to include a plurality of elements, and vice versa, unless the context clearly indicates otherwise.

In construing an element, the element is to be construed as including an error or tolerance range even where no explicit description of such an error or tolerance range is provided. Further, the term “may” fully encompasses all the meanings of the term “can.”

Where positional relationships are described, for example, where the positional relationship between two parts is described using “on,” “over,” “under,” “above,” “below,” “beside,” “next,” or the like, one or more other parts may be located between the two parts unless a more limiting term, such as “immediate(ly),” “direct(ly),” or “close(ly)” is used. For example, where an element or layer is disposed “on” another element or layer, a third element or layer may be interposed therebetween. Furthermore, the terms “left,” “right,” “top,” “bottom,” “downward,” “upward,” “upper,” “lower,” and the like refer to an arbitrary frame of reference. For the expression that an element or layer “contacts,” “overlaps,” or the like with another element or layer, the element or layer can not only directly contact, overlap, or the like with another element or layer, but indirectly contact, overlap, or the like with another element or layer with one or more intervening elements or layers "disposed" or "interposed" between the elements or layers, unless otherwise specified.

Time relative terms, such as "after," "subsequent to," "next to," "before," or the like, used to describe a temporal relationship between events, operations, or the like are generally intended to include events, situations, cases, operations, or the like that do not occur consecutively unless the terms, such as "directly," "immediately," or the like, are used. In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," and the like may be used herein to describe various elements, these elements should not be interpreted to be limited by these terms. These terms are used only to distinguish one element from another. For example, a first element could be termed a second element, and, similarly, a second element could be termed a first element, without departing from the scope.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified.

Hereinafter, various example embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings. In describing example embodiments of the present disclosure, equated or corresponding elements or configurations as embodiment previously described will not be repeatedly discussed. Discussions on example embodiments of the present disclosure are provided below.

Figure 1B:
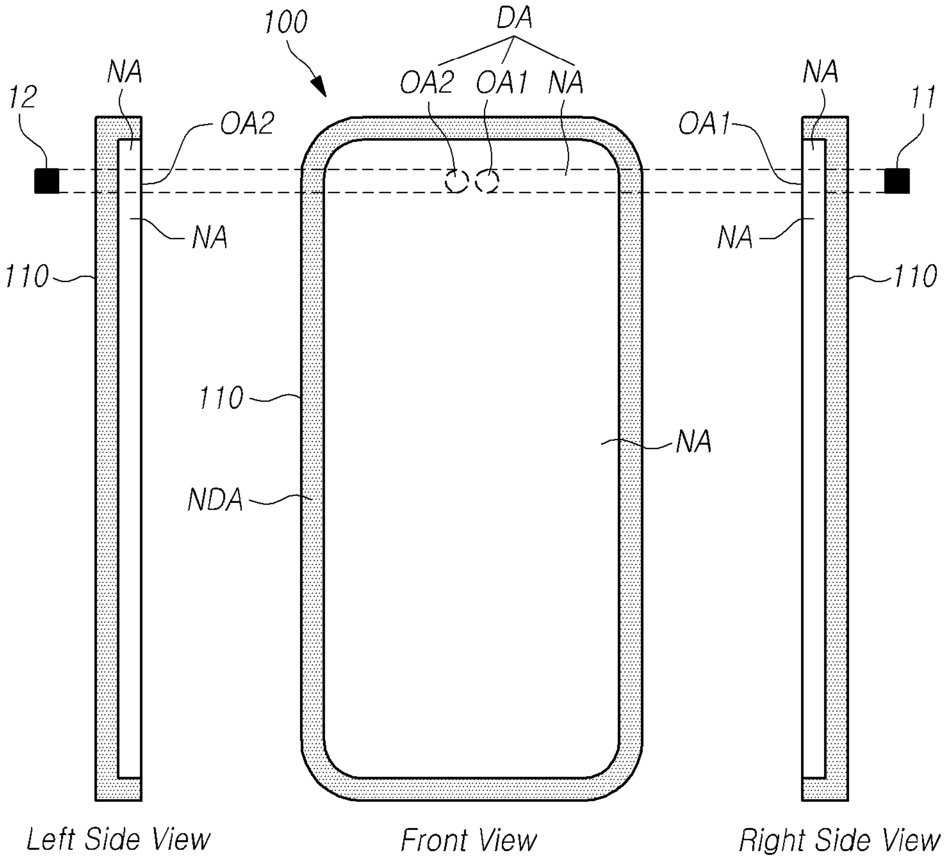
Figure 1C:
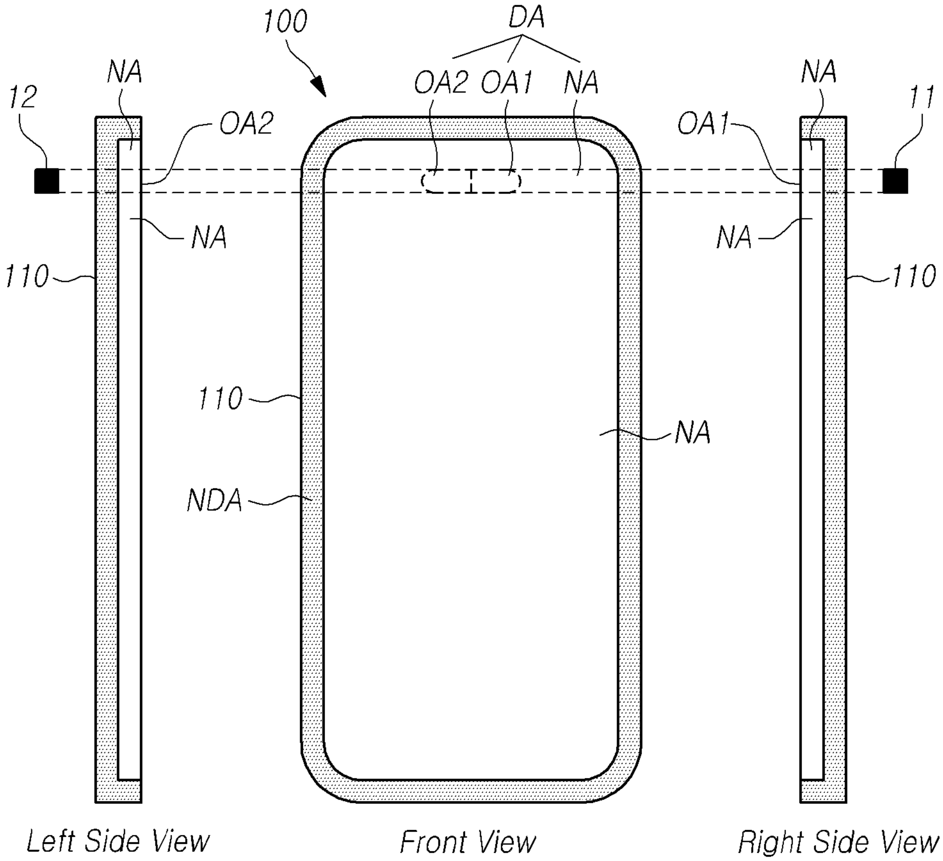

FIGS. 1A, 1B, and 1C illustrate an example display device 100 according to aspects of the present disclosure.

Referring to FIGS. 1A, 1B, and 1C, the display device 100 according to aspects of the present disclosure may include a display panel 110 for displaying one or more images, and one or more optical electronic devices (11 and/or 12). Herein, an optical electronic device may be referred to as a light detector, a light receiver, or a light sensing device. An optical electronic device may include one or more of a camera, a camera lens, a sensor, a sensor for detecting images, or the like.

The display panel 110 may include a display area DA in which one or more images are allowed to be displayed and a non-display area NDA in which an image is not displayed.

A plurality of subpixels may be arranged in the display area DA, and several types of signal lines for driving the plurality of subpixels may be arranged therein.

The non-display area NDA may refer to an area outside of the display area DA. Several types of signal lines may be arranged in the non-display area NDA, and several types of driving circuits may be connected thereto. At least a portion of the non-display area NDA may be bent to be invisible from the front surface of the display device 100 or may be covered by a case or housing (not shown) of the display device 100. The non-display area NDA may be also referred to as a bezel or a bezel area.

Referring to FIGS. 1A, 1B, and 1C, in the display device 100 according to aspects of the present disclosure, one or more optical electronic devices (11 and/or 12) may be prepared independently of, and installed in, the display panel 110, and be located under, or in a lower portion of, the display panel 110 (an opposite side of a viewing surface thereof).

Light can enter the front surface (the viewing surface) of the display panel 110, pass through the display panel 110, reach one or more optical electronic devices (11 and/or 12) located under, or in the lower portion of, the display panel 110 (the opposite side of the viewing surface). Light passing through the display panel 110 may include, for example, visible light, infrared light, or ultraviolet light.

The one or more optical electronic devices (11 and/or 12) may be devices configured to receive or detect light passing through the display panel 110 and perform a predefined function based on the received light. For example, the one or more optical electronic devices (11 and/or 12) may include one or more of the following: an image capture device such as a camera (an image sensor), and/or the like; or a sensor such as a proximity sensor, an illuminance sensor, and/or the like. Such a sensor may be, for example, an infrared sensor capable of detecting infrared light.

Referring to FIGS. 1A, 1B, and 1C, in one or more aspects, the display area DA of the display panel 110 according to aspects of the present disclosure may include one or more optical areas (OA1 and/or OA2) and a normal area NA. Herein, the term "normal area" NA is an area that while being present in the display area DA, does not overlap with one or more optical electronic devices (11 and/or 12) and may also be referred to as a non-optical area. The one or more optical areas (OA1 and/or OA2) may be one or more respective areas overlapping the one or more optical electronic devices (11 and/or 12) in a cross-sectional view of the display panel 110.

According to an example of FIG. 1A, the display area DA may include a first optical area OA1 and a normal area NA. In this example, at least a portion of the first optical area OA1 may overlap a first optical electronic device 11.

According to an example of FIG. 1B, the display area DA may include a first optical area OA1, a second optical area OA2, and a normal area NA. In this example, a portion of the normal area NA may be present between the first optical area OA1 and the second optical area OA2. At least a portion of the first optical area OA1 may overlap the first optical electronic device 11, and at least a portion of the second optical area OA2 may overlap a second optical electronic device 12.

According to an example of FIG. 1C, the display area DA may include a first optical area OA1, a second optical area OA2, and a normal area NA. In this example, the normal area NA may not be present between the first optical area OA1 and the second optical area OA2. For example, the first optical area OA1 and the second optical area OA2 may contact each other (e.g., directly contact each other). In this example, at least a portion of the first optical area OA1 may overlap the first optical electronic device 11, and at least a portion of the second optical area OA2 may overlap the second optical electronic device 12.

In the display panel 110 or the display device 100 according to aspects of the present disclosure, it may be desirable that both an image display structure and a light transmission structure are implemented in the one or more optical areas (OA1 and/or OA2). For example, since the one or more optical areas (OA1 and/or OA2) are portions of the display area DA, it is therefore desirable that light emitting areas of subpixels for displaying one or more images are disposed in the one or more optical areas (OA1 and/or OA2). Further, to enable light to pass through the one or more optical electronic devices (11 and/or 12), it may be desirable that a light transmission structure is implemented in the one or more optical areas (OA1 and/or OA2).

It should be noted that even though the one or more optical electronic devices (11 and/or 12) are devices that need to receive light, the one or more optical electronic devices (11 and/or 12) may be located on the back of the display panel 110 (e.g., on an opposite side of the viewing surface thereof), and thereby, can receive light that has passed through the display panel 110. For example, the one or more optical electronic devices (11 and/or 12) may not be exposed in the front surface (viewing surface) of the display panel 110 or the display device 100. Accordingly, when a user faces the front surface of the display device 100, the one or more optical electronic devices (11 and/or 12) are located so that they are not visible to the user.

The first optical electronic device 11 may be, for example, a camera, and the second optical electronic device 12 may be, for example, a sensor. The sensor may be a proximity sensor, an illuminance sensor, an infrared sensor, and/or the like. In one or more embodiments, the camera may be a camera lens, an image sensor, or a unit including at least one of the camera lens and the image sensor, and the sensor may be an infrared sensor capable of detecting infrared light. In another embodiment, the first optical electronic device 11 may be a sensor, and the second optical electronic device 12 may be a camera.

Hereinafter, for convenience of descriptions related to the optical electronic devices (11 and 12), the first optical electronic device 11 is considered to be a camera, and the second optical electronic device 12 is considered to be an infrared sensor. It should be, however, understood that the scope of the present disclosure includes examples where the first optical electronic device 11 is an infrared sensor, and the second optical electronic device 12 is a camera. The camera may be, for example, a camera lens, an image sensor, or a unit including at least one of the camera lens and the image sensor.

In an example where the first optical electronic device 11 is a camera, this camera may be located on the back of (e.g., under, or in a lower portion of) the display panel 110, and be a front camera capable of capturing objects or images in a front direction of the display panel 110. Accordingly, the user can capture an image or object through the camera that is invisible on the viewing surface while looking at the viewing surface of the display panel 110.

Although the normal area NA and the one or more optical areas (OA1 and/or OA2) included in the display area DA in each of FIGS. 1A, 1B, and 1C are areas where images are allowed to be displayed, the normal area NA is an area where a light transmission structure need not be implemented, but the one or more optical areas (OA1 and/or OA2) are areas where a light transmission structure need be implemented. Thus, in one or more embodiments, the normal area NA is an area where a light transmission structure is not implemented or included, and the one or more optical areas (OA1 and/or OA2) are areas in which a light transmission structure is implemented or included.

Accordingly, the one or more optical areas (OA1 and/or OA2) can have a transmittance greater than or equal to a predetermined level, e.g., a relatively high transmittance, and the normal area NA can have a transmittance less than the predetermined level, e.g., a relatively low transmittance or not have light transmittance.

For example, the one or more optical areas (OA1 and/or OA2) may have a resolution, a subpixel arrangement structure, the number of subpixels per unit area, an electrode structure, a line structure, an electrode arrangement structure, a line arrangement structure, and/or the like different from that/those of the normal area NA.

In one embodiment, the number of subpixels per unit area in the one or more optical areas (OA1 and/or OA2) may be less than the number of subpixels per unit area in the normal area NA. For example, the resolution of the one or more optical areas (OA1 and/or OA2) may be lower than that of the normal area NA. In this example, the number of subpixels per unit area may have the same meaning as a resolution, a pixel density, or a degree of integration of pixels. For example, the unit of the number of subpixels per unit area may be pixels per inch (PPI), which represents the number of pixels within 1 inch.

In the examples of FIGS. 1A, 1B, and 1C, the number of subpixels per unit area in the first optical areas OA1 may be less than the number of subpixels per unit area in the normal area NA. In the examples of FIGS. 1B and 1C, the number of subpixels per unit area in the second optical areas OA2 may be greater than or equal to the number of subpixels per unit area in the first optical areas OA1, and be less than the number of subpixels per unit area in the normal area NA.

In one or more embodiments, as a method for increasing respective transmittance of at least one of the first optical area OA1 and the second optical area OA2, a technique (which may be referred to as a "pixel density differentiation design scheme") may be applied so that a density of pixels (or subpixels) or a degree of integration of pixels (or subpixels) can be differentiated as described above. According to the pixel density differentiation design scheme, in an embodiment, the display panel 110 may be configured or designed such that the number of subpixels per unit area of at least one of the first optical area OA1 and the second optical area OA2 is greater than the number of subpixels per unit area of the normal area NA.

In one or more embodiments, as another method for increasing respective transmittance of at least one of the first optical area OA1 and the second optical area OA2, a technique (which may be referred to as a "pixel size differentiation design scheme") may be applied so that a size of a pixel (or a subpixel) can be differentiated. According to the pixel size differentiation design scheme, the display panel PNL may be configured or designed such that the number of subpixels per unit area of at least one of the first optical area OA1 and the second optical area OA2 is equal to or similar to the number of subpixels per unit area of the normal area NA; however, a size of each subpixel (e.g., a size of a corresponding light emitting area) disposed in at least one of the first optical area OA1 and the second optical area OA2 is smaller than a size of each subpixel (e.g., a size of a corresponding light emitting area) disposed in the normal area NA.

In one or more aspects, for convenience of description, discussions that follow are provided based on the pixel density differentiation design scheme of the two schemes (e.g., the pixel density differentiation design scheme and the pixel size differentiation design scheme) for increasing respective transmittance of at least one of the first optical area OA1 and the second optical area OA2, unless explicitly stated otherwise. It should be therefore understood that in descriptions that follow, a small number of subpixels per unit area may be considered as corresponding to a small size of subpixel, and a large number of subpixels per unit area may be considered as corresponding to a large size of subpixel.

In the examples of FIGS. 1A, 1B, and 1C, the first optical area OA1 may have various shapes, such as a circle, an ellipse, a quadrangle, a hexagon, an octagon or the like. In the examples of FIGS. 1B and 1C, the second optical area OA2 may have various shapes, such as a circle, an ellipse, a quadrangle, a hexagon, an octagon or the like. The first optical area OA1 and the second optical area OA2 may have the same or substantially or nearly the same shape, or different shapes.

Referring to FIG. 1C, in the example where the first optical area OA1 and the second optical area OA2 contact each other (e.g., directly contact each other), the entire optical area including the first optical area OA1 and the second optical area OA2 may also have various shapes, such as a circle, an ellipse, a quadrangle, a hexagon, an octagon or the like. Hereinafter, for convenience of descriptions related to shapes of the optical areas (OA1 and OA2), each of the first optical area OA1 and the second optical area OA2 is considered to have a circular shape. It should be, however, understood that the scope of the present disclosure includes examples where at least one of the first optical area OA1 and the second optical area OA2 have a shape other than a circular shape.

According to one or more aspects of the present disclosure, when the display device 100 has a structure in which the first optical electronic device 11 such as a camera, and the like is located under, or in a lower portion of, the display panel 100 without being exposed to the outside, such a display device may be referred to as a display in which a under-display camera (UDC) technology is implemented.

The display device 100 in which such a under-display camera (UDC) technology is implemented can provide an advantage of preventing an reduction of an area or size of the display area DA because a notch or a camera hole for exposing a camera need not be formed in the display panel 110. Indeed, since the notch or the camera hole for camera exposure need not be formed in the display panel 110, the display device 100 can provide further advantages of reducing the size of the bezel area, and improving the degree of freedom in design because such limitations to the design are removed.

Although the one or more optical electronic devices (11 and/or 12) are located on the back of (e.g., under, or in a lower portion of) the display panel 110 of the display device 100 (e.g., hidden or not exposed to the outside), the one or more optical electronic devices (11 and/or 12) are required to perform their normal predefined functionalities by receiving or detecting light.

Further, although one or more optical electronic devices (11 and/or 12) are located on the back of (e.g., under, or in a lower portion of) the display panel 110 to be hidden and located to be overlap the display area DA, it is desirable that the display device 100 is configured to normally display one or more images in the one or more optical areas (OA1 and/or OA2) overlapping the one or more optical electronic devices (11 and/or 12) in the display area DA. Thus, even though one or more optical electronic devices (11 and/or 12) are located on the back of the display panel, the display device 100 according to aspects of the present disclosure can be configured to display images in a normal manner (e.g., without reduction in image quality) in the one or more optical areas (OA1 and/or OA2) overlapping the one or more optical electronic devices (11 and/or 12) in the display area DA.

Since the foregoing first optical area OA1 is configured or designed as a transmittable area, the quality of image display in the first optical area OA1 may be different from the quality of image display in the normal area NA.

Further, when designing the first optical area OA1 for the purpose of improving the quality of image display, there may be caused a situation that the transmittance of the first optical area OA1 is reduced.

To address these issues, in one or more aspects, the first optical area OA1 included in the display device 100 or the display panel may be configured with, or include, a structure capable of preventing a difference (e.g., non-uniformity) in image quality between the first optical area OA1 and the normal area NA from being caused, and improving the transmittance of the first optical area OA1.

Further, not only the first optical area OA1, but the second optical area OA2 included in the display device 100 or the display panel 110 according to aspects of the present disclosure may be configured with, or include, a structure capable of improving the image quality of the second optical area OA2, and improving the transmittance of the second optical area OA2.

It should be also noted that the first optical area OA1 and the second optical area OA2 included in the display device 100 or the display panel 110 according to aspects of the present disclosure may be differently implemented or have different utilization examples while having a similarity in terms of light transmittable areas. Taking account of such a distinction, the structure of the first optical area OA1 and the structure of the second optical area OA2 in the display device 100 according to aspects of the present disclosure may be configured or designed differently from each other.

Figure 2:
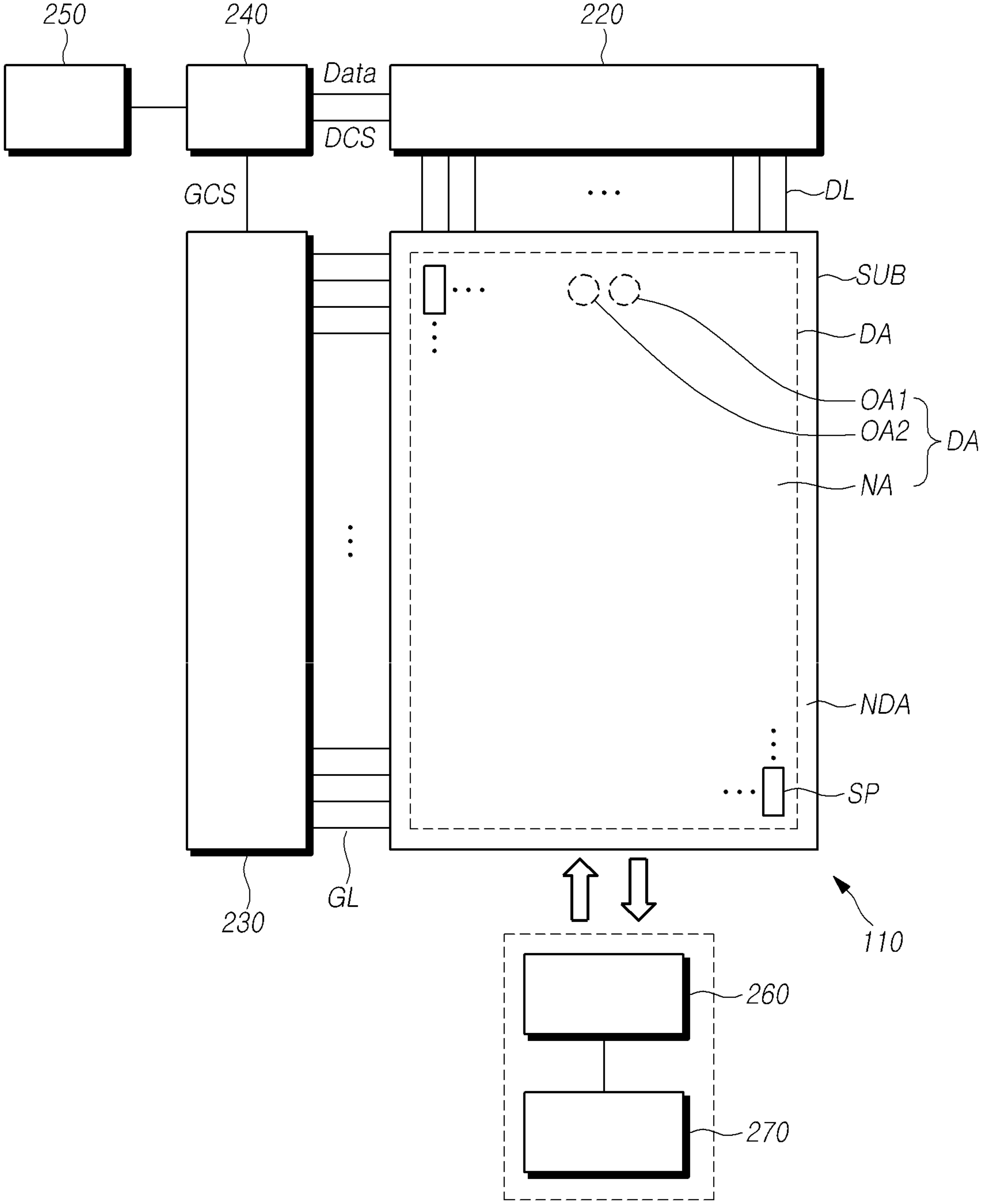
FIG. 2 illustrates an example system configuration of the display device according to aspects of the present disclosure.

FIG. 2 illustrates an example system configuration of the display device 100 according to one or more embodiments of the present disclosure.

FIG. 2 illustrates an example system configuration of the display device 100 according to one or more embodiments of the present disclosure. Referring to FIG. 2, the display device 100 may include the display panel 110 and a display driving circuit as components for displaying one or more images.

The display driving circuit is a circuit for driving the display panel 110, and may include a data driving circuit 220, a gate driving circuit 230, a display controller 240, and other circuit components.

The display panel 110 may include a display area DA in which one or more images are allowed to be displayed and a non-display area NDA in which an image is not displayed. The non-display area NDA may be an area outside of the display area DA, and may also be referred to as an edge area or a bezel area. All or a portion of the non-display area NDA may be an area visible from the front surface of the display device 100, or an area that is bent and invisible from the front surface of the display device 100.

The display panel 110 may include a substrate SUB and a plurality of subpixels SP disposed on the substrate SUB. The display panel 110 may further include various types of signal lines to drive the plurality of subpixels SP.

The display device 100 according to aspects of the present disclosure may be a liquid crystal display device, or the like, or a self-emission display device in which light is emitted from the display panel 110 itself. In examples where the display device 100 according to aspects of the present disclosure is implemented as a self-emission display device, each of the plurality of subpixels SP may include a light emitting element. For example, the display device 100 according to aspects of the present disclosure may be an organic light emitting display device implemented with one or more organic light emitting diodes (OLED). In another example, the display device 100 according to aspects of the present disclosure may be an inorganic light emitting display device implemented with one or more inorganic material-based light emitting diodes. In further another example, the display device 100 according to aspects of the present disclosure may be a quantum dot display device implemented with quantum dots, which are self-emission semiconductor crystals.

The structure of each of the plurality of subpixels SP may be differently configured or designed according to types of the display devices 100. For example, in an example where the display device 100 is a self-emission display device including self-emission subpixels SP, each subpixel SP may include a self-emission light emitting element, one or more transistors, and one or more capacitors.

In one or more embodiments, various types of signal lines arranged in the display device 100 may include, for example, a plurality of data lines DL for carrying data signals (which may be referred to as data voltages or image signals), a plurality of gate lines GL for carrying gate signals (which may be referred to as scan signals), and the like.

The plurality of data lines DL and the plurality of gate lines GL may intersect each other. Each of the plurality of data lines DL may extend in a first direction. Each of the plurality of gate lines GL may extend in a second direction different from the first direction. For example, the first direction may be a column or vertical direction, and the second direction may be a row or horizontal direction. In another example, the first direction may be the row or horizontal direction, and the second direction may be the column or vertical direction. Hereinafter, for convenience of explanation, discussions will be provided based on examples where each of the plurality of data lines DL is disposed in the column direction and each of the plurality of gate lines GL is disposed in the row direction.

The data driving circuit 220 may be a circuit for driving the plurality of data lines DL, and can supply data signals to the plurality of data lines DL. The gate driving circuit 230 may be a circuit for driving the plurality of gate lines GL, and can supply gate signals to the plurality of gate lines GL.

The display controller 240 may be a device for controlling the data driving circuit 220 and the gate driving circuit 230, and can control driving times for the plurality of data lines DL and driving times for the plurality of gate lines GL.

The display controller 240 can supply a data driving control signal DCS to the data driving circuit 220 to control the data driving circuit 220, and supply a gate driving control signal GCS to the gate driving circuit 230 to control the gate driving circuit 230.

The display controller 240 can receive input image data from a host system 250 and supply image data Data to the data driving circuit 220 based on the input image data.

The data driving circuit 220 can receive digital image data Data from the display controller 240, convert the received image data Data into analog data signals, and supply the resulting analog data signals to the plurality of data lines DL.

The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In one or more embodiments, the data driving circuit 220 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In one or more embodiments, the gate driving circuit 230 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 may be disposed in the non-display area NDA of the display panel 110 in a gate in panel (GIP) type. The gate driving circuit 230 may be disposed on or over the substrate, or connected to the substrate. That is, in the case of the GIP type, the gate driving circuit 230 may be disposed in the non-display area NDA of the substrate. In the case of the chip on glass (COG) type, the chip on film (COF) type, or the like, the gate driving circuit 230 may be connected to the substrate.

In one or more embodiments, at least one of the data driving circuit 220 and the gate driving circuit 230 may be disposed in the display area DA of the display panel 110. For example, at least one of the data driving circuit 220 and the gate driving circuit 230 may be disposed such that it does not overlap subpixels SP, or disposed such that it overlaps one or more, or all, of the subpixels SP, or at least respective one or more portions of one or more subpixels.

The data driving circuit 220 may be located on, but not limited to, only one side or portion (e.g., an upper edge or a lower edge) of the display panel 110. In one or more embodiments, the data driving circuit 220 may be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 may be located in only one side or portion (e.g., a left edge or a right edge) of the display panel 110. In one or more embodiments, the gate driving circuit 230 may be connected to two sides or portions (e.g., a left edge and a right edge) of the display panel 110, or be connected to at least two of four sides or portions (e.g., an upper edge, a lower edge, the left edge, and the right edge) of the display panel 110 according to driving schemes, panel design schemes, or the like.

The display controller 240 may be implemented in a separate component from the data driving circuit 220, or integrated with the data driving circuit 220 and thus implemented in an integrated circuit.

The display controller 240 may be a timing controller used in the typical display technology or a controller or a control device capable of performing other control functions in addition to the function of the typical timing controller. In one or more embodiments, the display controller 140 may be a controller or a control device different from the timing controller, or a circuitry or a component included in the controller or the control device. The display controller 240 may be implemented with various circuits or electronic components such as an integrated circuit (IC), a field programmable gate array (FPGA), an application specific integrated circuit (ASIC), a processor, and/or the like.

The display controller 240 may be mounted on a printed circuit board, a flexible printed circuit, and/or the like and be electrically connected to the gate driving circuit 220 and the data driving circuit 230 through the printed circuit board, flexible printed circuit, and/or the like.

The display controller 240 may transmit signals to, and receive signals from, the data driving circuit 220 via one or more predefined interfaces. For example, such interfaces may include a low voltage differential signaling (LVDS) interface, an embedded clock point-point (EPI) interface, a serial peripheral interface (SPI), and the like.

In order to further provide a touch sensing function, as well as an image display function, the display device 100 according to aspects of the present disclosure may include at least one touch sensor, and a touch sensing circuit capable of detecting whether a touch event occurs by a touch object such as a finger, a pen, or the like, or of detecting a corresponding touch position, by sensing the touch sensor.

The touch sensing circuit may include: a touch driving circuit 260 capable of generating and providing touch sensing data by driving and sensing the touch sensor; a touch controller 270 capable of detecting the occurrence of a touch event or detecting a touch position using the touch sensing data; and one or more other components.

The touch sensor may include a plurality of touch electrodes. The touch sensor may further include a plurality of touch lines for electrically connecting the plurality of touch electrodes to the touch driving circuit 260.

The touch sensor may be implemented in a touch panel, or in the form of a touch panel, outside of the display panel 110, or be implemented inside of the display panel 110. In the example where the touch sensor is implemented in the touch panel, or in the form of the touch panel, outside of the display panel 110, such a touch sensor is referred to as an add-on type. In the example where such an add-on type of touch sensor is disposed, the touch panel and the display panel 110 may be separately manufactured and coupled during an assembly process. The add-on type of touch panel may include a touch panel substrate and a plurality of touch electrodes on the touch panel substrate.

In order to have the touch sensor implemented inside of the display panel 110, a process of manufacturing the display panel 110 may include disposing the touch sensor over the substrate SUB together with signal lines and electrodes related to driving the display device 100.

The touch driving circuit 260 can supply a touch driving signal to at least one of the plurality of touch electrodes, and sense at least one of the plurality of touch electrodes to generate touch sensing data.

The touch sensing circuit can perform touch sensing using a self-capacitance sensing technique or a mutual-capacitance sensing technique.

In the example where the touch sensing circuit performs touch sensing in the self-capacitance sensing technique, the touch sensing circuit can perform touch sensing based on capacitance between each touch electrode and a touch object (e.g., a finger, a pen, and the like). According to the self-capacitance sensing technique, each of the plurality of touch electrodes can serve as both a driving touch electrode and a sensing touch electrode. The touch driving circuit 260 can drive all, or one or more, of the plurality of touch electrodes and sense all, or one or more, of the plurality of touch electrodes.

In the example where the touch sensing circuit performs touch sensing in the mutual-capacitance sensing technique, the touch sensing circuit can perform touch sensing based on capacitance between touch electrodes. According to the mutual-capacitance sensing technique, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit may be implemented in separate devices or in a single device. Further, the touch driving circuit 260 and the data driving circuit 220 may be implemented in separate devices or in a single device.

The display device 100 may further include a power supply circuit for supplying various types of power to the display driving circuit and/or the touch sensing circuit.

The display device 100 according to aspects of the present disclosure may represent, but not limited to, a mobile terminal such as a smart phone, a tablet, or the like, a monitor, a television (TV), or the like. Such devices may be of various types, sizes, and shapes. The display device 100 according to embodiments of the present disclosure are not limited thereto, and may include displays of various types, sizes, and shapes for displaying information or images.

As described above, the display area DA of the display panel 110 may include the normal area NA and the one or more optical areas (OA1 and/or OA2) as illustrated in FIGS. 1A, 1B, and 1C. The normal area NA and the one or more optical areas (OA1 and/or OA2) may be areas where one or more images are allowed to be displayed. It should be noted here that the normal NA may be an area in which a light transmission structure need not be implemented, and the one or more optical areas (OA1 and/or OA2) may be areas in which a light transmission structure need be implemented.

As discussed above with respect to the examples of FIGS. 1A, 1B, and 1C, even though the display area DA of the display panel 110 may include the one or more optical areas (OA1 and/or OA2) together with the normal area NA, for convenience of description, discussions that follow will be provided based on embodiments where the display area DA includes both the first and second optical areas OA1 and OA2 (e.g., the first optical area OA1 of FIGS. 1A, 1B, and 1C, and the second optical area OA2 of FIGS. 1B and 1C) and the normal area NA (e.g., the normal area NA of FIGS. 1A, 1B, and 1C).

Figure 3:
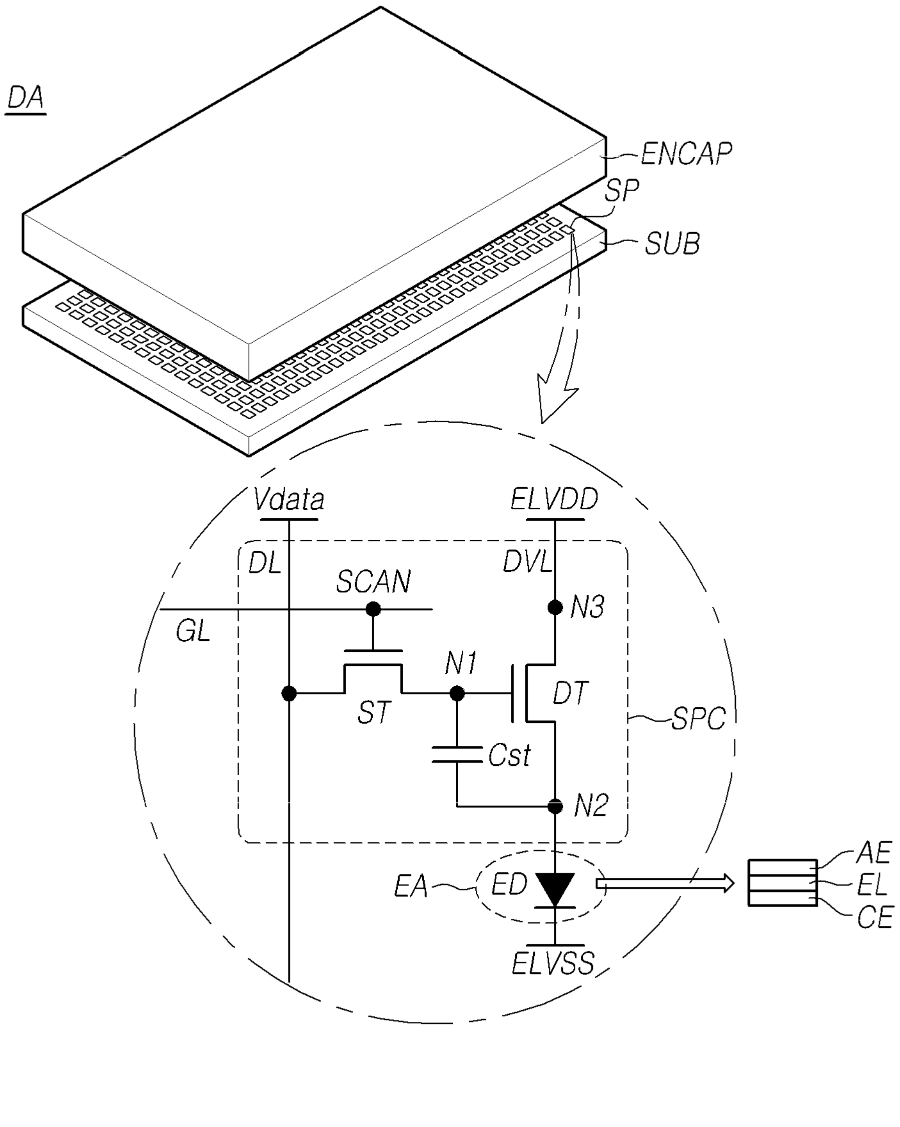
FIG. 3 illustrates an example display panel according to aspects of the present disclosure.

FIG. 3 illustrates an example system configuration of the display device 100 according to aspects of the present disclosure.

Referring to FIG. 3, a plurality of subpixels SP may be disposed in the display area DA of the display panel 110. The plurality of subpixels SP may be disposed in a normal area (e.g., the normal area of FIGS. 1A, 1B, and 1C), a first optical area (e.g., the first optical area OA1 of FIGS. 1A, 1B, and 1C), and a second optical area (e.g., the second optical area OA2 of FIGS. 1B and 1C) included in the display area DA of the display panel 110.

Referring to FIG. 3, each of the plurality of subpixels SP may include a light emitting element ED and a subpixel circuit SPC configured to drive the light emitting element ED.

Referring to FIG. 3, each subpixel circuit SPC may include a driving transistor DT for driving the light emitting element ED, a scan transistor ST for transmitting a data voltage Vdata to a first node N1 of the driving transistor DT, a storage capacitor Cst for maintaining a voltage at an approximate constant level during one frame, and the like.

The driving transistor DT may include the first node N1 to which a data voltage is applied, a second node N2 electrically connected to the light emitting element ED, and a third node N3 to which a driving voltage ELVDD through a driving voltage line DVL is applied. In the driving transistor DT, the first node N1 may be a gate node, the second node N2 may be a source node or a drain node, and the third node N3 may be the drain node or the source node. For convenience of description, descriptions that follow will be provided based on examples where the first, second and third nodes (N1, N2 and N3) of the driving transistor DT are gate, source and drain nodes, respectively, unless explicitly stated otherwise. However, it should be understood that the scope of the present disclosure includes examples where the first, second and third nodes (N1, N2 and N3) of the driving transistor DT are gate, drain and source nodes, respectively.

The light emitting element ED may include an anode electrode AE, an emission layer EL, and a cathode electrode CE. The anode electrode AE may represent a pixel electrode disposed in each subpixel SP, and may be electrically connected to the second node N2 of the driving transistor DT of each subpixel SP. The cathode electrode CE may represent a common electrode being common to the plurality of subpixels SP, and a base voltage ELVSS such as a low-level voltage may be applied to the cathode electrode CE.

For example, the anode electrode AE may be a pixel electrode, and the cathode electrode CE may be a common electrode. In another example, the anode electrode AE may be a common electrode, and the cathode electrode CE may be a pixel electrode. For convenience of description, discussions that follow will be provided based on examples where the anode electrode AE is a pixel electrode, and the cathode electrode CE is a common electrode unless explicitly stated otherwise. However, it should be understood that the scope of the present disclosure includes examples where the anode electrode AE is a common electrode, and the cathode electrode CE is a pixel electrode.

The light emitting element ED may include a light emitting area EA having a predetermined size or area. The light emitting area EA of the light emitting element ED may be defined as, for example, an area with which all or two or more of an anode electrode AE, the emission layer EL, and the cathode electrode CE are overlapped.

The light emitting element ED may be, for example, an organic light emitting diode (OLED), an inorganic light emitting diode, a quantum dot light emitting element, or the like. In an embodiment where an organic light emitting diode (OLED) is used as the light emitting element ED, the emission layer EL thereof may include an organic emission layer including an organic material.

The scan transistor ST may be turned on and off by a scan signal SCAN that is a gate signal applied through a gate line GL, and be electrically connected between the first node N1 of the driving transistor DT and a data line DL.

The storage capacitor Cst may be electrically connected between the first node N1 and the second node N2 of the driving transistor DT.

The subpixel circuit SPC may be configured with two transistors (2T: DRT and SCT) and one capacitor (1C: Cst) (which may be referred to as a "2T1C structure") as shown in FIG. 3, and in some implementations, may further include one or more transistors, and/or further include one or more capacitors.

In one or more embodiments, the storage capacitor Cst, which may be present between the first node N1 and the second node N2 of the driving transistor DT, may be an external capacitor intentionally configured or designed to be located outside of the driving transistor DT, other than internal capacitors, such as parasitic capacitors (e.g., a gate-to-source capacitance Cgs, a gate-to-drain capacitance Cgd, and the like). Each of the driving transistor DT and the scan transistor ST may be an n-type transistor or a p-type transistor.

Since circuit elements (e.g., in particular, a light emitting element ED, which is implemented with an organic light emitting diode including an organic material) included in each subpixel SP are vulnerable to external moisture or oxygen, an encapsulation layer ENCAP may be disposed in the display panel 110 in order to prevent external moisture or oxygen from penetrating into such circuit elements. The encapsulation layer ENCAP may be disposed such that it covers the light emitting element ED.

Figure 4:
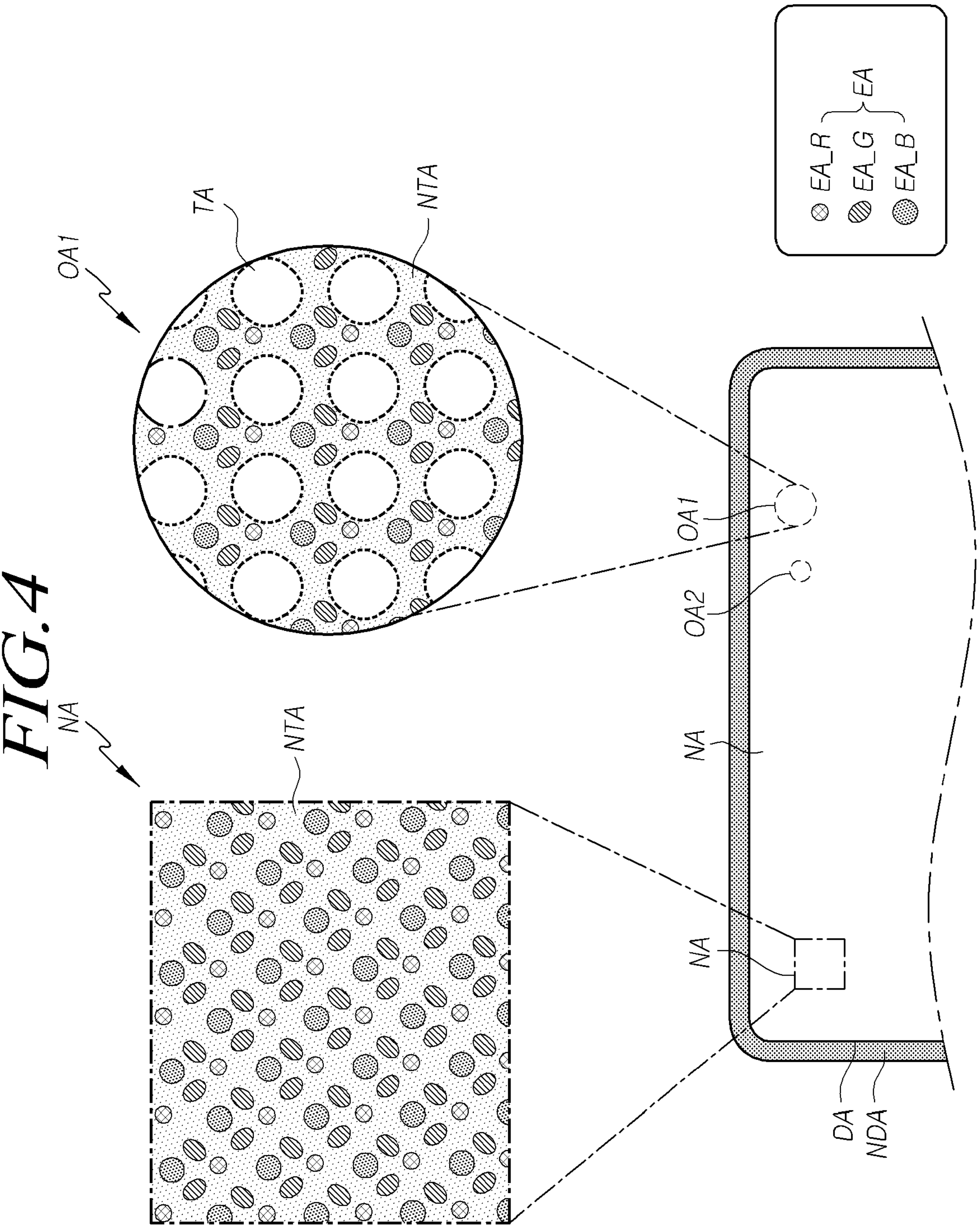
FIG. 4 illustrates an example normal area, and an example first optical area included in the display panel according to aspects of the present disclosure.
Figure 5:
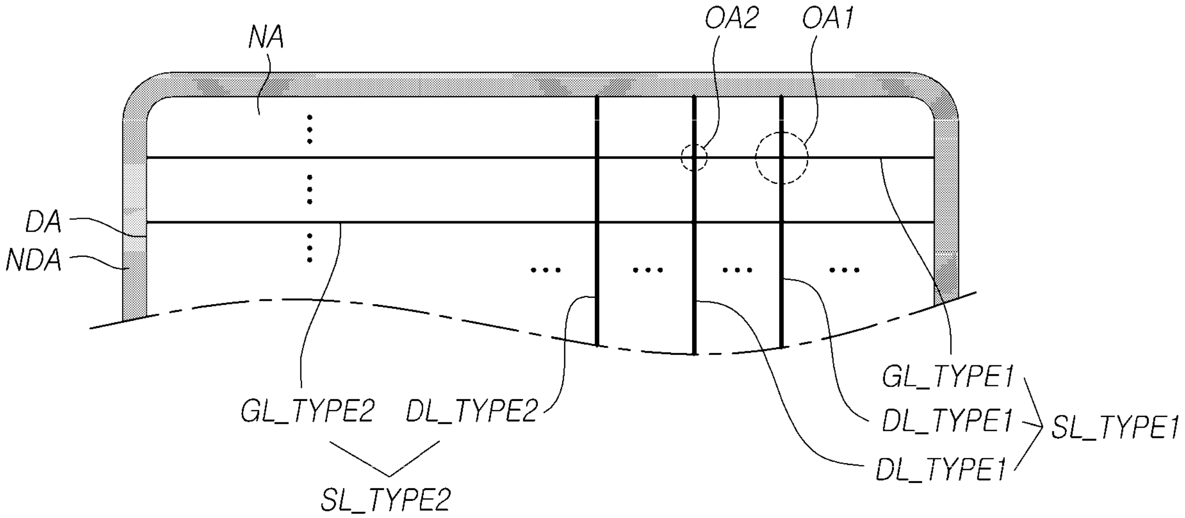
FIG. 5 illustrates an example first type signal line and an example second type signal line included in the display panel according to aspects of the present disclosure.

FIG. 4 illustrates an example normal area (e.g., the normal area NA of FIGS. 1A, 1B, and 1C), and an example first optical area (e.g., the first optical area OA1 of FIGS. 1A, 1B, and 1C) included in the display panel 110 according to aspects of the present disclosure. FIG. 5 illustrates an example first type signal line SL_TYPE1 and an example second type signal line SL_TYPE2 included in the display panel 110 according to aspects of the present disclosure.

Referring to FIG. 4, in one or more aspects, the display panel 110 may include the display area DA where one or more images are allowed to be displayed and the non-display area NDA where an image is not displayed.

Referring to FIG. 4, the display area DA may include the first optical area OA1 and the normal area NA located outside of the first optical area OA1.

Referring to FIG. 4, the first optical area OA1 may represent an area overlapping the first optical electronic device 11, and may be, for example, a transmittable area through which light needed for the operation of the first optical electronic device 11 can be transmitted.

For example, the first optical area OA1 may be configured to allow, but not limited to, at least one of visible light, infrared light, ultraviolet light, and the like to be transmitted. In an embodiment when the first optical electronic device 11 is a camera, the first optical area OA1 may be configured to allow visible light to be transmitted for the operation of the camera. In another embodiment when the first optical electronic device 11 is an infrared sensor, the first optical area OA1 may be configured to allow infrared light to be transmitted for the operation of the infrared sensor.

For example, the first optical area OA1 may have various shapes such as a circular shape, an elliptical shape, a polygonal shape, an irregular shape, or the like.

Referring to FIG. 4, the display area DA may include a plurality of light emitting areas EA. Since the first optical area OA1 and the normal area NA are areas included in the display area DA, each of the first optical area OA1 and the normal area NA may include a plurality of light emitting areas EA.

For example, the plurality of light emitting areas EA may include a first color light emitting area emitting light of a first color, a second color light emitting area emitting light of a second color, and a third color light emitting area emitting light of a third color.

At least one of the first color light emitting area, the second color light emitting area, and the third color light emitting area may have a different area or size from the remaining one or more light emitting areas.

The first color, the second color, and the third color may be different colors from one another, and may be various colors. For example, the first color, second color, and third color may be or include red, green, and blue, respectively.

Hereinafter, for convenience of description, the first color, the second color, and the third color is considered to be red, green, and blue, respectively. However, embodiments of the present disclosure are not limited thereto.

In the example where the first color, the second color, and the third color is red, green, and blue, respectively, an area of a blue light emitting area EA_B may be the largest among an area of a red light emitting area EA_R, an area of a green light emitting area EA_G, and the area of the blue light emitting area EA_B.

A light emitting element ED disposed in the red light emitting area EA_R may include an emission layer EL emitting red light. A light emitting element ED disposed in the green light emitting area EA_G may include an emission layer EL emitting green light. A light emitting element ED disposed in the blue light emitting area EA_B may include an emission layer EL emitting blue light.

Among the emission layer EL emitting red light, the emission layer EL emitting green light, and the emission layer EL emitting blue light, an organic material included in the emission layer EL emitting blue light may be most easily degraded in terms of material.

In one or more embodiments, as the blue light emitting area EA_B is configured or designed to have the largest area or size, current density supplied to the light emitting element ED disposed in the blue light emitting area EA_B may be the least. Therefore, a degradation degree of a light emitting element ED disposed in the blue light emitting area EA_B may be similar to a degradation degree of a light emitting element ED disposed in the red light emitting area EA_R and a degradation degree of a light emitting element ED disposed in the green light emitting area EA_G.

In consequence, a difference in degradation between the light emitting element ED disposed in the red light emitting area EA_R, the light emitting elements ED disposed in the green light emitting area EA_G, and the light emitting elements ED disposed in the blue light emitting area EA_B can be eliminated or reduced, and therefore, the display device 100 or the display panel 110 according to aspects of the present disclosure can provide an advantage of improving image quality.

Referring to FIG. 4, the first optical area OA1 may be a transmittable area, and therefore, be desirable to have high transmittance. To meet this requirement, a cathode electrode CE is disposed in the display area DA of the display panel 110 and may include a plurality of cathode holes CH in the first optical area OA1. In one or more embodiments, a portion corresponding the first optical area OA1 of the cathode electrode CE disposed across the first optical area OA1 and the normal area NA or a cathode electrode CE disposed in the first optical area OA1 may include a plurality of cathode holes CH.

Referring to FIG. 4, in one or more embodiments, a portion corresponding the normal area NA of the cathode electrode CE disposed across the first optical area OA1 and the normal area NA or a cathode electrode CE disposed in the normal area NA may not include a cathode hole CH. That is, in the normal area NA, the portion of the cathode electrode CE or the cathode electrode CE may not include a cathode hole CH.

In the first optical area OA1, the plurality of cathode holes CH formed in the portion of the cathode electrode CE or the cathode electrode CE may be referred to as a plurality of first transmission areas TA1 or a plurality of opening areas. Although FIG. 4 illustrates that one cathode hole CH has a circular shape, one or more cathode holes CH may have various shapes other than the circular shape, such as an elliptical shape, a polygonal shape, an irregular shape or the like.

Referring to FIG. 4, a second optical area (e.g., the second optical area OA2 in figures described above) may be disposed adjacent to the first optical area OA1. An arrangement of light emitting areas EA in the second optical area OA2 will be described in more detail with reference to FIG. 15.

Referring to FIG. 4, the normal area NA may include a non-transmission area NTA including a plurality of light emitting areas EA.

All or at least a portion of the normal area NA may be configured with the non-transmission area NTA, and in an example where all of the normal area NA is configured with the non-transmission area NTA, the normal area NA may not include a transmission area TA.

Referring to FIG. 4, the first optical area OA1 may include a non-transmission area NTA including a plurality of light emitting areas EA, and may further include at least one transmission area TA. A transmission area is an area in which light can pass through the display panel.

Referring to FIGS. 4 and 5, in one or more aspects, the display area DA of the display panel 110 may include a plurality of signal lines, as well as the plurality of light emitting areas EA.

A plurality of light emitting elements ED (e.g., a plurality of light emitting diodes, and the like) disposed in the plurality of light emitting areas EA may be disposed in the display area DA, and a plurality of subpixel circuits SPC for driving the plurality of light emitting elements ED may be disposed in the display area DA.

The plurality of signal lines disposed in the display area DA can carry several types of display driving signals to the plurality of subpixel circuits SPC.

For example, the display driving signals may include data signals Vdata, scan signals SCAN and the like. The display driving signals may further include at least one driving voltage ELVDD or a respective signal corresponding to the at least one driving voltage ELVDD.

The plurality of signal lines may include a plurality of data lines DL for carrying data signals Vdata and a plurality of gate lines GL for carrying gate signals such as scan signals SCAN, and the like. The plurality of signal lines may further include at least one driving voltage line DVL for transmitting the at least one driving voltage ELVDD.

Referring to FIG. 5, the plurality of signal lines may include a plurality of first type signal lines SL_TYPE1 running across, namely extending across, the first optical area OA1 and/or the second optical area OA2 (i.e., the first optical area OA1 and/or the second optical area OA2 means just the first optical area OA1, or just the second optical area OA2, or both the first optical area OA1 and the second optical area OA2), and a plurality of second type signal lines SL_TYPE2 disposed only in the normal area NA without extending to the first optical area OA1 and/or the second optical area OA2.

Referring to FIG. 5, each of the plurality of first type signal lines SL_TYPE1 may include a part (e.g., a first part) disposed in at least one of the first optical area OA1 and the second optical area OA2 and another part (e.g., a second part) disposed in the normal area NA.

Referring to FIG. 5, in one or more embodiments, the plurality of first type signal lines SL_TYPE1 may include at least one data line DL_TYPE1 running across the first optical area OA1, at least one data line DL_TYPE1 running across the second optical area OA2, and at least one gate line GL_TYPE1 running across at least one of the first optical area OA1 and the second optical area OA2.

Referring to FIG. 5, the plurality of second type signal lines SL_TYPE2 may include at least one data line DL_TYPE2 disposed only in the normal area NA and at least one gate line GL_TYPE2 disposed only in the normal area NA.

At least one of the plurality of first type signal lines SL_TYPE1 may include at least one transparent line part disposed in at least one transmission area TA of the first optical area OA1 and at least one non-transparent line part disposed in the non-transmission area NTA of the first optical area OA1.

A respective transparent line part and a respective non-transparent line part of at least one first type signal line SL_TYPE1 running across the first optical region OA1 may be located in different layers.

Likewise, at least one of the plurality of first type signal lines SL_TYPE1 may include at least one transparent line part disposed in at least one transmission area TA of the second optical area OA2 and at least one non-transparent line part disposed in a non-transmission area NTA of the second optical area OA2.

A respective transparent line part and a respective non-transparent line part of at least one first type signal line SL_TYPE1 running across the second optical region OA2 may be located in different layers.

Each of the plurality of second type signal lines SL_TYPE2 may be configured with only a respective non-transparent line part. For example, each of the plurality of second type signal lines SL_TYPE2 may include a metal included in respective non-transparent line parts of the plurality of first type signal lines SL_TYPE1.

As discussed above, the cathode electrode CE may be disposed in the display area DA. For example, the cathode electrode CE may be disposed in the normal area NA, the first optical area OA1, and the second optical area OA2, for example, as a one body or in respective separate bodies.

In an embodiment, the cathode electrode CE may extend to a portion of the non-display area NDA.

The cathode electrode CE may be located on a plurality of first type signal lines SL_TYPE1 running across at least one of the first optical area OA1 and the second optical area OA2.

As described above, in order to improve respective transmittance of each of the first and second optical areas OA1 and OA2, the cathode electrode CE may include a plurality of cathode holes CH located in the first optical area OA1 and include a plurality of cathode holes CH located in the second optical area OA2.

However, a cathode hole CH may not be formed in a portion of the cathode electrode CE, or a cathode electrode CE, located in the normal area NA not including a non-transmission area NTA. In the normal area NA including only a non-transmission area NTA, the cathode hole CH may not be formed in the cathode electrode CE. Hereinafter, one cathode electrode CE may be disposed on the display panel 110. Alternatively, a plurality of cathode electrodes CE may be disposed on the display panel 110. Although a plurality of separate cathode electrodes CE may be disposed in the display area DA of the display panel 110, for convenience of explanation, it is assumed that a single cathode electrode CE is commonly formed in the normal area NA, the first optical area OA1, and the second optical area OA2 and is common to the figures. However, it should be understood that the scope of the present disclosure includes examples where a plurality cathode electrodes CE are formed separately. The cathode electrode CE is disposed in the display area DA and may extend to the non-display area NDA.

Figure 6:
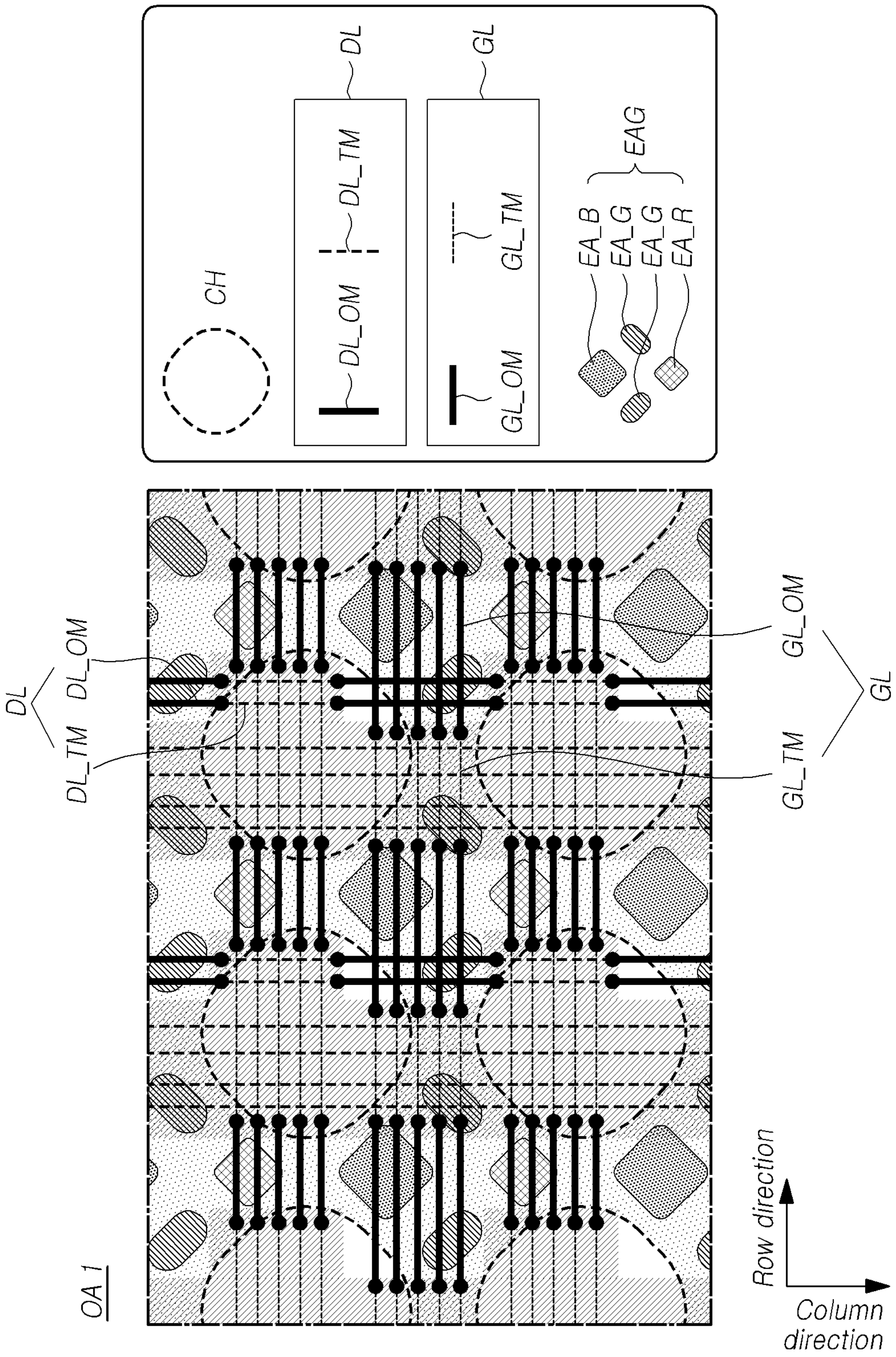
FIG. 6 illustrates an example plan view of the first optical area of the display panel according to aspects of the present disclosure.

FIG. 6 is an example plan view of the first optical area OA1 of the display panel 110 according to aspects of the present disclosure.

Referring to FIG. 6, a plurality of first type signal lines SL_TYPE1 running across the first optical area OA1 among a plurality of signal lines disposed in the display panel 110 may include a plurality of gate lines GL and a plurality of data lines DL.

For example, each of the plurality of gate lines GL may be disposed to extend in a first direction (e.g., a row direction). Each of the plurality of data lines DL may be disposed to extend in a second direction (e.g., a column direction).

Each of the plurality of gate lines GL may include at least one transparent gate line part GL_TM disposed in at least one transmission area TA of the first optical area OA1 and at least one non-transparent gate line part GL_OM disposed in a non-transmission area NTA of the first optical area OA1.

The at least one transparent gate line part GL_TM and the at least one non-transparent gate line part GL_OM of each of the plurality of gate lines GL may be electrically connected to each other.

Each of the plurality of data lines DL may include at least one transparent data line part DL_TM disposed in at least one transmission area TA of the first optical area OA1 and at least one non-transparent data line part DL_OM disposed in the non-transmission area NTA of the first optical area OA1.

The at least one transparent data line part DL_TM and the at least one non-transparent data line part DL_OM of each of the plurality of data lines DL may be electrically connected to each other.

The respective non-transparent gate line part GL_OM of the plurality of gate lines GL may include a first gate metal.

The respective transparent gate line part GL_OM of the plurality of gate lines GL may include a first transparent conductive material.

The respective non-transparent data line part DL_OM of the plurality of data lines DL may include a first source-drain metal.

The respective transparent data line part DL_OM of the plurality of data lines DL may include a second transparent conductive material.

As described above, in one or more aspects, the display panel 110 may include the display area DA allowing one or more images to be displayed and including a plurality of light emitting areas EA and a plurality of signal lines, the non-display area NDA in which an image is not displayed, and the cathode electrode CE disposed to overlap the display area DA.

The display area DA may include the first optical area OA1 and the normal area NA located outside of the first optical area OA1. The normal area NA may include a non-transmission area NTA including a plurality of light emitting areas EA.

The first optical area OA1 may include a non-transmission area NTA including a plurality of light emitting areas EA, and may further include at least one transmission area TA.

The cathode electrode CE may include a plurality of cathode holes CH, and the plurality of cathode holes CH may be located in the first optical area OA1.

The first type signal lines SL_TYPE1 running across the first optical area OA1 among the plurality of signal lines may include at least one non-transparent line part (e.g., DL_OM or GL_OM) and at least one transparent line part (e.g., DL_TM or GL_TM).

All or a portion of a respective transparent line part (e.g., DL_TM or GL_TM) of each of the first type signal line SL_TYPE1 may overlap at least one cathode hole CH.

For example, all or a portion of the first optical area OA1 can be configured to allow one or more of visible light, infrared light, and ultraviolet light to be transmitted.

Hereinafter, an arrangement structure of the plurality of light emitting areas EA and the plurality of first type signal lines SL_TYPE1 included in the first optical area OA1 will be described.

Referring to FIG. 6, the first optical area OA1 may include a plurality of light emitting area groups EAG, and the plurality of light emitting area groups EAG may be disposed to be spaced apart from one another. For example, one light emitting area group EAG may include one red light emitting area EA_R, two green light emitting areas EA_G, and one blue light emitting area EA_B.

Referring to FIG. 6, at least one cathode hole CH may be disposed between the plurality of light emitting area groups (EAG: EAG #1, EAG #2, EAG #3, and EAG #4).

Referring to FIG. 6, in one or more embodiments, the plurality of first type signal lines SL_TYPE1 (e.g., DL and GL) running across the first optical area OA1 may include at least one transparent line part (e.g., DL_TM or GL_TM), and the transparent line part (e.g., DL_TM or GL_TM) may overlap a cathode hole CH. That is, each of the plurality of cathode holes CH may overlap all or a portion of a transparent line part (e.g., DL_TM or GL_TM) included in each of the first type signal lines SL_TYPE1.

Referring to FIG. 6, the first optical area OA1 may include the non-transmission area NTA and the at least one transmission area TA that is an area except for the non-transmission area NTA.

The non-transmission area NTA may be an area through which light cannot be transmitted between the front and rear surfaces of the display panel 110, and include light emitting areas EA from which light for display is emitted by light emitting elements ED.

The transmission area TA may be an area except for the non-transmission area NTA, and be an area through which light can be transmitted between the front and rear surfaces of the display panel 110.

At least one respective non-transparent line part (e.g., DL_OM or GL_OM) and at least one respective transparent line part (e.g. DL_TM or GL_TM) of at least one of the first type signal lines SL_TYPE1 may be disposed in the non-transmission area NTA and the transmission area TA, respectively.

In an embodiment, all of one cathode hole CH may serve as a transmission area TA. In another embodiment, a portion of one cathode hole CH may serve as a transmission area TA, and the remaining portion may serve as the non-transmission area NTA.

A place at which a non-transparent line part (e.g., DL_OM or GL_OM) and a transparent line part (e.g., DL_TM or GL_TM) of at least one of the first type signal lines SL_TYPE1 are connected to each other may be configured with a contact hole, which serves as a jumping connection bridge as a structure for connecting elements located in different layers to each other.

The place at which the non-transparent line part (e.g., DL_OM or GL_OM) and the transparent line part (e.g., DL_TM or GL_TM) are connected to each other may be located at an edge (or near the edge) of a cathode hole CH.

At least one respective non-transparent line part (e.g., DL_OM or GL_OM) of at least one of the first type signal lines SL_TYPE1 may overlap one or more light emitting areas EA of the non-transmission area NTA. For example, the at least one non-transparent line part (e.g., DL_OM or GL_OM) of the first type signal line SL_TYPE1 may be located under one or more light emitting elements causing one or more light emitting areas EA of the non-transmission area NTA to be formed.

The display panel 110 may further include an insulating layer (e.g., insulating layers INS in FIGS. 8 and 9) located between the transparent line part and the non-transparent line part of the first type signal line SL_TYPE1, and a connection pattern (e.g., connection patterns CP_DL or CP_GL of FIGS. 8 and 9) for electrically connecting the transparent line part to the non-transparent line part through a hole formed in the insulating layer.

Figure 7:
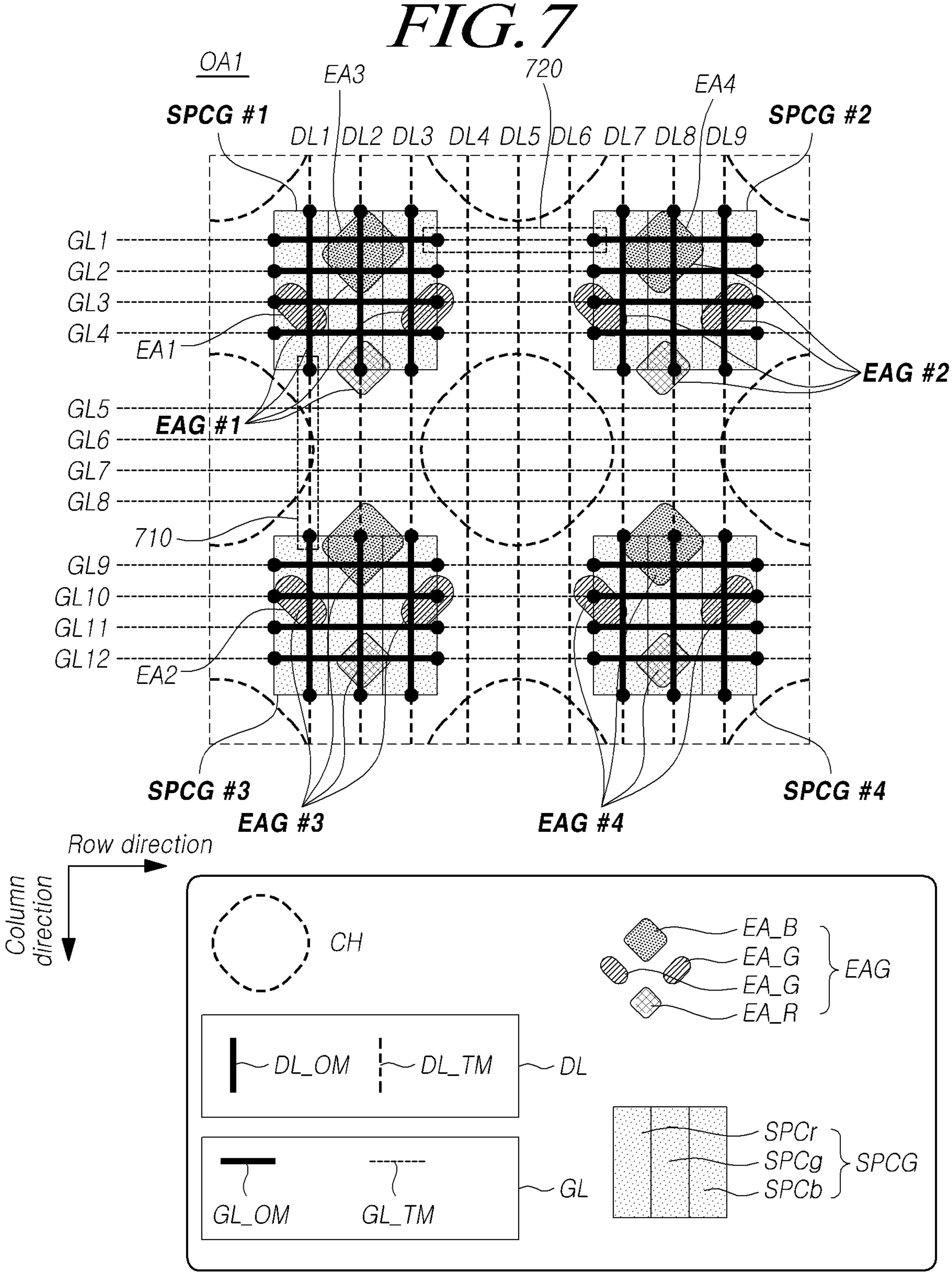
FIG. 7 illustrates an example planar structure of the first optical area of the display panel according to aspects of the present disclosure.

FIG. 7 illustrates an example planar structure of the first optical area OA1 of the display panel 110 according to aspects of the present disclosure.

Referring to FIG. 7, the first optical area OA1 may include a plurality of light emitting area groups EAG, a plurality of subpixel circuit groups SPCG, and a plurality of first type signal lines SL_TYPE1 (e.g., DL and GL).

For example, the plurality of light emitting area groups EAG may include a first light emitting area group EAG #1, a second light emitting area group EAG #2, a third light emitting area group EAG #3, and a fourth light emitting area group EAG #4.

The first light emitting area group EAG #1, the second light emitting area group EAG #2, the third light emitting area group EAG #3, and the fourth light emitting area group EAG #4 may be disposed to be spaced apart from one another.

An area between two adjacent light emitting area groups among the first light emitting area group EAG #1, the second light emitting area group EAG #2, the third light emitting area group EAG #3, and the fourth light emitting area group EAG #4 may be a transmission area TA or a non-transmission area NTA.

A cathode hole CH may be present in an area between two adjacent light emitting area groups among the first light emitting area group EAG #1, the second light emitting area group EAG #2, the third light emitting area group EAG #3, and the fourth light emitting area group EAG #4.

For example, the first light emitting area group EAG #1 and the fourth light emitting area group EAG #4 may be disposed adjacent to each other in a first diagonal direction, and a cathode hole CH may be disposed between the first light emitting area group EAG #1 and the fourth light emitting area group EAG #4.

For example, the second light emitting area group EAG #2 and the third light emitting area group EAG #3 may be disposed adjacent to each other in a second diagonal direction, and a cathode hole CH may be disposed between the second light emitting area group EAG #2 and the third light emitting area group EAG #3.

Referring to FIG. 7, each of the first light emitting area group EAG #1, the second light emitting area group EAG #2, the third light emitting area group EAG #3, and the fourth light emitting area group EAG #4 may include one red light emitting area EA_R, two green light emitting areas EA_G, and one blue light emitting area EA_B.

One red light emitting area EA_R, two green light emitting areas EA_G, and one blue light emitting area EA_B included in each of the first light emitting area group EAG #1, the second light emitting area group EAG #2, the third light emitting area group EAG #3, and the fourth light emitting area group EAG #4 may be disposed to be adjacent to one another.

In one or more embodiments, one red light emitting element ED emitting red light for image display may be disposed in one red light emitting area EA_R, and two green light emitting elements ED emitting green light for image display may be disposed in two green light emitting areas EA_G, and one blue light emitting element ED emitting blue light for image display may be disposed in one blue light emitting area EA_B.

Referring to FIG. 7, the plurality of subpixel circuit groups (SPCG: SPCG #1, SPCG #2, SPCG #3, and SPCG #4) may be circuits for driving the plurality of light emitting area groups (EAG: EAG #1, EAG #2, EAG #3, and EAG #4).

The plurality of subpixel circuit groups (SPCG: SPCG #1, SPCG #2, SPCG #3, and SPCG #4) may include a first subpixel circuit group SPCG #1 for driving the first light emitting area group EAG #1, a second subpixel circuit group SPCG #2 for driving the second light emitting area group EAG #2, a third subpixel circuit group SPCG #3 for driving the third light emitting area group EAG #3, and a fourth subpixel circuit group SPCG #4 for driving the fourth light emitting area group EAG #4.

Each of the first subpixel circuit group SPCG #1, the second subpixel circuit group SPCG #2, the third subpixel circuit group SPCG #3, and the fourth subpixel circuit group SPCG #4 may include a red subpixel circuit SPCr for driving one red light emitting element ED, a green subpixel circuit SPCg for driving two green light emitting elements ED, and a blue subpixel circuit SPCb for driving one blue light emitting element ED.

The green subpixel circuit SPCg included in each of the first subpixel circuit group SPCG #1, the second subpixel circuit group SPCG #2, the third subpixel circuit group SPCG #3, and the fourth subpixel circuit group SPCG #4 can drive the two green light emitting elements ED simultaneously or together or at different timings.

Referring to FIG. 7, a plurality of first type signal lines SL_TYPE1 running across the first optical area OA1 may include a plurality of data lines (DL1 to DL9) and a plurality of gate lines (GL1 to GL12).

Referring to FIG. 7, among the plurality of data lines (DL1 to DL9) of the plurality of first type signal lines SL_TYPE1, first, second, and third data lines (DL1, DL2, and DL3) may be connected to the first subpixel circuit group SPCG #1 and the third subpixel circuit group SPCG #3, and seventh, eighth, and ninth data lines (DL7, DL8, and DL9) may be connected to the second subpixel circuit group SPCG #2 and the fourth subpixel circuit group SPCG #4.

The first, second, and third data lines (DL1, DL2, and DL3) may be connected to three subpixel circuits (SPCr, SPCg, and SPCb) of the first subpixel circuit group SPCG #1, and connected to three subpixel circuits (SPCr, SPCg, and SPCb) of the third subpixel circuit group SPCG #3.

The first, second, and third data lines (DL1, DL2, and DL3) can respectively supply data signals Vdata to the three subpixel circuits (SPCr, SPCg, and SPCb) of the first subpixel circuit group SPCG #1 at a first data driving time, and can respectively supply data signals Vdata to the three subpixel circuits (SPCr, SPCg, and SPCb) of the third subpixel circuit group SPCG #3 at a second data driving time different from the first data driving time.

The seventh, eighth, and ninth data lines (DL7, DL8, and DL9) may be connected to three subpixel circuits (SPCr, SPCg, and SPCb) of the second subpixel circuit group SPCG #2, and connected to three subpixel circuits (SPCr, SPCg, and SPCb) of the fourth subpixel circuit group SPCG #4.

The seventh, eighth, and ninth data lines (DL7, DL8, and DL9) can respectively supply data signals Vdata to the three subpixel circuits (SPCr, SPCg, and SPCb) of the second subpixel circuit group SPCG #2 at the first data driving time, and can respectively supply data signals Vdata to the three subpixel circuits (SPCr, SPCg, and SPCb) of the fourth subpixel circuit group SPCG #4 at the second data driving time different from the first data driving time.

Referring to FIG. 7, among the plurality of data lines (DL1 to DL9) of the plurality of first type signal lines SL_TYPE1, fourth, fifth, and sixth data lines (DL4, DL5, and DL6) may be disposed in an area between the first subpixel circuit group SPCG #1 and the second subpixel circuit group SPCG #2, and be disposed in an area between the third subpixel circuit group SPCG #3 and the fourth subpixel circuit group SPCG #4.

The fourth, fifth, and sixth data lines (DL4, DL5, and DL6) may be connected to, for example, one or more other subpixel circuit groups different from the first to fourth subpixel circuit groups (SPCG #1, SPCG #2, SPCG #3, and SPCG #4). In this example, the one or more other subpixel circuit groups may be disposed in the first optical area OA1 or in the normal area NA.

Referring to FIG. 7, each of the first, second, and third data lines (DL1, DL2, and DL3) may include at least one non-transparent data line part DL_OM and at least one transparent data line part DL_TM.

Respective one non-transparent data line part DL_OM of the first, second, and third data lines (DL1, DL2, and DL3) may be respectively connected to the three subpixel circuits (SPCr, SPCg, and SPCb) of the first subpixel circuit group SPCG #1 disposed in the non-transmission area NTA.

Respective another non-transparent data line part DL_OM of the first, second, and third data lines (DL1, DL2, and DL3) may be respectively connected to the three subpixel circuits (SPCr, SPCg, and SPCb) of the third subpixel circuit group SPCG #3 disposed in the non-transmission area NTA.

Respective one transparent data line part DL_TM of the first, second, and third data lines (DL1, DL2, and DL3) may be disposed in a transmission area TA located outside of areas in which the first subpixel circuit group SPCG #1 and the third subpixel circuit group SPCG #3 are disposed.

Referring to FIG. 7, each of the seventh, eighth, and ninth data lines (DL7, DL8, and DL9) may include at least one non-transparent data line part DL_OM and at least one transparent data line part DL_TM.

Respective one non-transparent data line part DL_OM of the seventh, eighth, and ninth data lines (DL7, DL8, and DL9) may be respectively connected to the three subpixel circuits (SPCr, SPCg, and SPCb) of the second subpixel circuit group SPCG #2 disposed in the non-transmission area NTA.

Respective another non-transparent data line part DL_OM of the seventh, eighth, and ninth data lines (DL7, DL8, and DL9) may be respectively connected to the three subpixel circuits (SPCr, SPCg, and SPCb) of the fourth subpixel circuit group SPCG #4 disposed in the non-transmission area NTA.

Respective one transparent data line part DL_TM of the seventh, eighth, and ninth data lines (DL7, DL8, and DL9) may be disposed in a transmission area TA located outside of areas in which the second subpixel circuit group SPCG #2 and the fourth subpixel circuit group SPCG #4 are disposed.

Referring to FIG. 7, each of fourth, fifth, and sixth data lines (DL4, DL5, and DL6) may include a transparent data line part DL_TM, and be disposed in a transmission area TA located outside of areas in which the first, second, third, and fourth subpixel circuit group (SPCG #1, SPCG #2, SPCG #3 and SPCG #4) are disposed.

Referring to FIG. 7, the fourth, fifth, and sixth data lines (DL4, DL5, and DL6) may overlap at least one cathode hole CH.

Referring to FIG. 7, among the plurality of gate lines (GL1 to GL12) of the plurality of first type signal lines SL_TYPE1, first, second, third, and fourth gate lines (GL1, GL2, GL3, and GL4) may be connected to the first subpixel circuit group SPCG #1 and the second subpixel circuit group SPCG #2, and ninth, tenth, eleventh, and twelfth gate lines (GL9, GL10, GL11, and GL12) may be connected to the third subpixel circuit group SPCG #3 and the fourth subpixel circuit group SPCG #4.

The first, second, third, and fourth gate lines (GL1, GL2, GL3, and GL4) may be connected to the three subpixel circuits (SPCr, SPCg, and SPCb) of the first subpixel circuit group SPCG #1, and be connected to the three subpixel circuits (SPCr, SPCg, and SPCb) of the second subpixel circuit group SPCG #2.

The first, second, third, and fourth gate lines (GL1, GL2, GL3, and GL4) may be gate lines for driving four light emitting elements ED disposed in four light emitting areas (EA_R, EA_G, EA_G, and EA_B) of the first light emitting area group EAG #1 corresponding to the first subpixel circuit group SPCG #1.

The first, second, third, and fourth gate lines (GL1, GL2, GL3, and GL4) may be gate lines for driving four light emitting elements ED disposed in four light emitting areas (EA_R, EA_G, EA_G, and EA_B) of the second light emitting area group EAG #2 corresponding to the second subpixel circuit group SPCG #2.

The first, second, third, and fourth gate lines (GL1, GL2, GL3, and GL4) can carry gate signals to the three subpixel circuits (SPCr, SPCg, and SPCb) of the first subpixel circuit group SPCG #1 and the three subpixel circuits (SPCr, SPCg, and SPCb) of the second subpixel circuit group SPCG #2 simultaneously or together or at different gate driving times.

The ninth, tenth, eleventh, and twelfth gate lines (GL9, GL10, GL11, and GL12) may be connected to the three subpixel circuits (SPCr, SPCg, and SPCb) of the third subpixel circuit group SPCG #3, and be connected to the three subpixel circuits (SPCr, SPCg, and SPCb) of the fourth subpixel circuit group SPCG #4.

The ninth, tenth, eleventh, and twelfth gate lines (GL9, GL10, GL11, and GL12) may be gate lines for driving four light emitting elements ED disposed in four light emitting areas (EA_R, EA_G, EA_G, and EA_B) of the third light emitting area group EAG #3 corresponding to the third subpixel circuit group SPCG #3.

The ninth, tenth, eleventh, and twelfth gate lines (GL9, GL10, GL11, and GL12) may be gate lines for driving four light emitting elements ED disposed in four light emitting areas (EA_R, EA_G, EA_G, and EA_B) of the fourth light emitting area group EAG #4 corresponding to the fourth subpixel circuit group SPCG #4.

The ninth, tenth, eleventh, and twelfth gate lines (GL9, GL10, GL11, and GL12) can carry gate signals to the three subpixel circuits (SPCr, SPCg, and SPCb) of the third subpixel circuit group SPCG #3 and the three subpixel circuits (SPCr, SPCg, and SPCb) of the fourth subpixel circuit group SPCG #4 simultaneously or together or at different gate driving times.

Referring to FIG. 7, among the plurality of gate lines (GL1 to GL12) of the plurality of first type signal lines SL_TYPE1, fifth, sixth, seventh, and eighth gate lines (GL5, GL6, GL7, and GL8) may be disposed in an area between the first subpixel circuit group SPCG #1 and the third subpixel circuit group SPCG #3, and be disposed in an area between the second subpixel circuit group SPCG #2 and the fourth subpixel circuit group SPCG #4.

The fifth, sixth, seventh, and eighth gate lines (GL5, GL6, GL7, and GL8) may be connected to, for example, one or more other subpixel circuit groups different from the first to fourth subpixel circuit groups (SPCG #1, SPCG #2, SPCG #3, and SPCG #4). In this example, the one or more other subpixel circuit groups may be disposed in the first optical area OA1 or in the normal area NA.

Referring to FIG. 7, each of the first, second, third, and fourth gate lines (GL1, GL2, GL3, and GL4) may include at least one non-transparent gate line part GL_OM and at least one transparent gate line part GL_TM.

Respective one non-transparent gate line part GL_OM of the first, second, third, and fourth gate lines (GL1, GL2, GL3, and GL4) may be connected to the three subpixel circuits (SPCr, SPCg, and SPCb) of the first subpixel circuit group SPCG #1 disposed in the non-transmission area NTA.

Respective another non-transparent gate line part GL_OM of the first, second, third, and fourth gate lines (GL1, GL2, GL3, and GL4) may be connected to the three subpixel circuits (SPCr, SPCg, and SPCb) of the second subpixel circuit group SPCG #2 disposed in the non-transmission area NTA.

Respective one transparent gate line part GL_TM of the first, second, third, and fourth gate lines (GL1, GL2, GL3, and GL4) may be disposed in a transmission area TA located outside of areas in which the first subpixel circuit group SPCG #1 and the second subpixel circuit group SPCG #2 are disposed.

Referring to FIG. 7, each of the ninth, tenth, eleventh, and twelfth gate lines (GL9, GL10, GL11, and GL12) may include at least one non-transparent gate line part GL_OM and at least one transparent gate line part GL_TM.

Respective one non-transparent gate line part GL_OM of the ninth, tenth, eleventh, and twelfth gate lines (GL9, GL10, GL11, and GL12) may be connected to the three subpixel circuits (SPCr, SPCg, and SPCb) of the third subpixel circuit group SPCG #3 disposed in the non-transmission area NTA.

Respective another non-transparent gate line part GL_OM of the ninth, tenth, eleventh, and twelfth gate lines (GL9, GL10, GL11, and GL12) may be connected to the three subpixel circuits (SPCr, SPCg, and SPCb) of the fourth subpixel circuit group SPCG #4 disposed in the non-transmission area NTA.

Respective one transparent gate line part GL_TM of the ninth, tenth, eleventh, and twelfth gate lines (GL9, GL10, GL11, and GL12) may be disposed in a transmission area TA located outside of areas in which the third subpixel circuit group SPCG #3 and the fourth subpixel circuit group SPCG #4 are disposed.

Referring to FIG. 7, each of the fifth, sixth, seventh, and eighth gate lines (GL5, GL6, GL7, and GL8) may include a transparent gate line part GL_TM, and be disposed in a transmission area TA located outside of areas in which the first, second, third, and fourth subpixel circuit group (SPCG #1. SPCG #2, SPCG #3 and SPCG #4) are disposed.

Referring to FIG. 7, the fifth, sixth, seventh, and eighth gate lines (GL5, GL6, GL7, and GL8) may overlap at least one cathode hole CH.

Referring to FIG. 7, each of the plurality of data lines (DL1 to DL9) of the plurality of first type signal lines SL_TYPE1 running across the first optical area OA1 may be disposed to extend in the column direction.

Each of the plurality of gate lines (GL1 to GL12) of the plurality of first type signal lines SL_TYPE1 running across the first optical area OA1 may be disposed to extend in the row direction.

Referring to FIG. 7, respective three subpixel circuits (SPCr, SPCg, and SPCb) of the first, second, third, and fourth subpixel circuit groups (SPCG #1, SPCG #2, SPCG #3, and SPCG #4) disposed in the first optical area OA1 may be arranged in the column direction.

Figure 8:
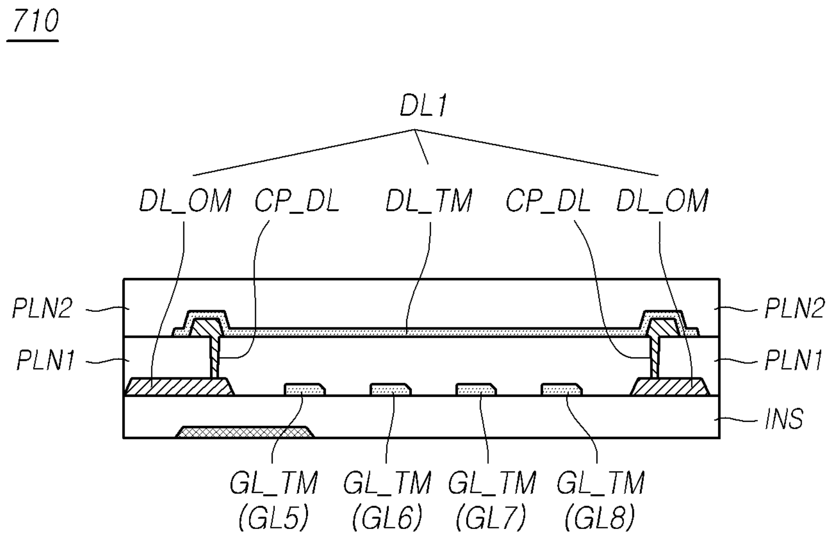
FIG. 8 illustrates an example stack structure of an area in a column direction in the configuration of FIG. 7.
Figure 9:
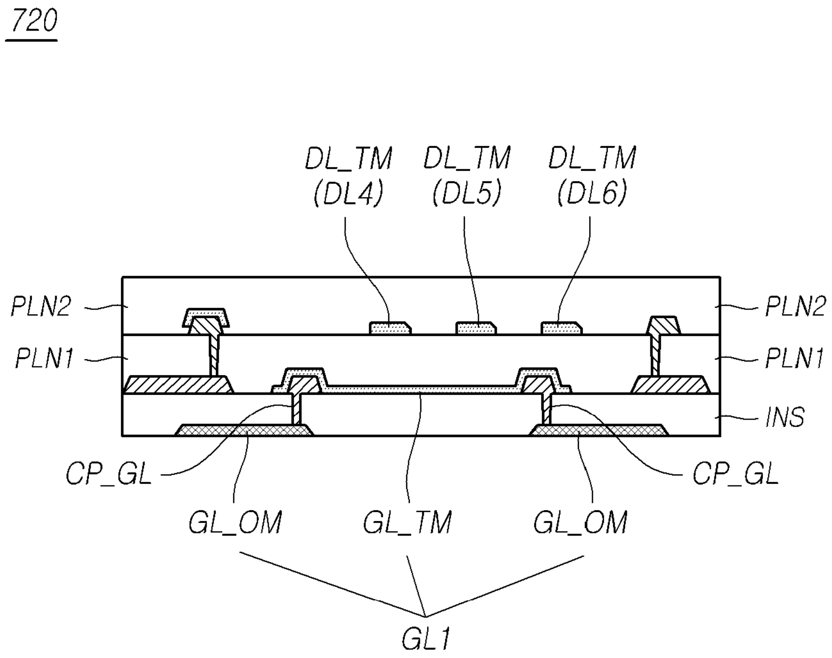
FIG. 9 illustrates an example stack structure of an area in a row direction in the configuration of FIG. 7.

FIG. 8 illustrates an example stack structure of an area in the column direction in the configuration of FIG. 7. FIG. 9 illustrates an example stack structure of an area in the row direction in the configuration of FIG. 7.

The stack structure of FIG. 8 represents a vertical structure of a portion 710 of an area where the first data line DL1 is disposed in the configuration of FIG. 7. The stack structure of FIG. 9 represents a vertical structure of a portion 720 of an area where the first gate line GL1 is disposed in the configuration of FIG. 7.

Referring to FIGS. 8 and 9, the display panel 110 may include, for example, an insulating layer INS, a first planarization layer PLN1, and a second planarization layer PLN2 over the substrate SUB. In this example, the insulating layer INS may include a plurality of layers configured with insulating property.

Referring to FIG. 8, the first data line DL1 may include, for example, at least one first transparent data line part DL_TM, and at least one first non-transparent data line part DL_OM. In one or more embodiments, both edges of the first transparent data line part DL_TM may be connected to one first non-transparent data line part DL_OM and another first non-transparent data line part DL_OM, respectively.

The at least one first transparent data line part DL_TM and the at least one first non-transparent data line part DL_OM of the first data line DL1 may be located in different layers.

The at least one first transparent data line part DL_TM of the first data line DL1 may be located between the first planarization layer PLN1 and the second planarization layer PLN2.

The at least one first non-transparent data line part DL_OM of the first data line DL1 may be located between the insulating layer INS and the first planarization layer PLN1.

At least one first data connection pattern CP_DL can electrically connect the first transparent data line part DL_TM to the at least one first non-transparent data line part DL_OM.

The at least one first data connection pattern CP_DL may be disposed on the first planarization layer and may include a second source-drain metal.

The at least one first data connection pattern CP_DL can electrically connect the first transparent data line part DL_TM to the at least one first non-transparent data line part DL_OM through at least one hole (e.g., at least one contact hole) formed in the first planarization layer PLN1.

In one or more embodiments, one edge of the first transparent data line part DL_TM of the first data line DL1 may be electrically connected to the one first non-transparent data line part DL_OM located under the first planarization layer PLN1 through one first data connection pattern CP_DL.

In one or more embodiments, the other edge of the first transparent data line part DL_TM of the first data line DL1 may be electrically connected to the another first non-transparent data line part DL_OM located under the first planarization layer PLN1 through another first data connection pattern CP_DL.

Each of the first data connection patterns CP_DL may be located on the first planarization layer PLN1 and be connected to the respective first non-transparent data line part DL_OM through a respective one of the at least one contact hole formed in the first planarization layer PLN1.

Each of both edges of the first transparent data line part DL_TM may be disposed on the first planarization layer PLN1 while contacting the upper surface and/or at least one side surface of the respective first data connection pattern CP_DL.

Referring to FIG. 9, the first gate line GL1 may include, for example, at least one first transparent gate line part GL_TM, and at least one first non-transparent gate line part GL_OM. In one or more embodiments, both edges of the first transparent gate line part GL_TM may be connected to one first non-transparent gate line part GL_OM and another first non-transparent gate line part GL_OM, respectively.

The at least one first transparent gate line part GL_TM and the at least one first non-transparent gate line part GL_OM of the first gate line GL1 may be located in different layers.

The at least one first transparent gate line part GL_TM of the first gate line GL1 may be located between the insulating layer INS and the first planarization layer PLN1.

The at least one first non-transparent gate line part GL_OM of the first gate line GL1 may be located under the insulating layer INS.

At least one first gate connection pattern CP_GL can electrically connect the first transparent gate line part GL_TM to the at least one first non-transparent gate line part GL_OM.

The at least one first gate connection pattern CP_GL may be disposed on a second interlayer insulating layer ILD2 and may include the first source-drain metal.

The at least one first gate connection pattern CP_GL can electrically connect the first transparent gate line part GL_TM to the at least one first non-transparent gate line part GL_OM through holes formed in the second interlayer insulating layer ILD2, a second gate insulating layer GI2, a second buffer layer BUF2, and a first interlayer insulating film ILD1.

One edge of the first transparent gate line part GL_TM of the first gate line GL1 may be electrically connected to the one first non-transparent gate line part GL_OM located under the insulating layer INS through one first gate connection pattern CP_GL.

The other edge of the first transparent gate line part GL_TM of the first gate line GL1 may be electrically connected to the another first non-transparent gate line part GL_OM located under the insulating layer INS through another first gate connection pattern CP_GL.

Each of the first gate connection patterns CP_GL may be located on the insulating layer INS and be connected to the respective first non-transparent gate line part GL_OM through a respective contact hole formed in the insulating layer INS.

Each of both edges of the first transparent gate line part GL_TM may be disposed on the insulating layer INS while contacting the upper surface and/or at least one side surface of the respective first gate connection pattern CP_GL.

For example, referring to FIG. 8, the at least one first non-transparent data line part DL_OM of the first data line DL1 may include the first source-drain metal, and the at least one first transparent data line part DL_TM thereof may include the second transparent conductive material.

For example, referring to FIG. 8, in the first data line DL1, the at least one data connection pattern CP_DL may include the second source-drain metal.

For example, referring to FIG. 9, the at least one first non-transparent gate line part GL_OM of the first gate line GL1 may include the first gate metal, and the at least one first transparent gate line part GL_TM thereof may include the first transparent conductive material.

In one or more aspects, the display panel 110 may include, as conductive material layers, a first gate metal layer including the first gate metal, a first source-drain metal layer including the first source-drain metal, a first transparent conductive material layer including the first transparent conductive material, a second source-drain metal layer including the second source-drain metal, and a second transparent conductive material layer including the second transparent conductive material.

Referring to FIG. 8, the plurality of first type signal lines SL_TYPE1 may include gate lines (e.g., GL5, GL6, GL7, and GL8) different from the first gate line GL1.

These gate lines (GL5, GL6, GL7, and GL8) may include respective first transparent gate line parts GL_TM overlapping the first transparent data line part DL_TM of the first data line DL1.

Referring to FIG. 9, the plurality of first type signal lines SL_TYPE1 may include data lines (e.g., DL4, DL5, and DL6) different from the first data line DL1.

These data lines (DL4, DL5, and DL6) may include respective first transparent data line parts DL_TM overlapping the first transparent gate line part GL_TM of the first gate line GL1.

Figure 10:
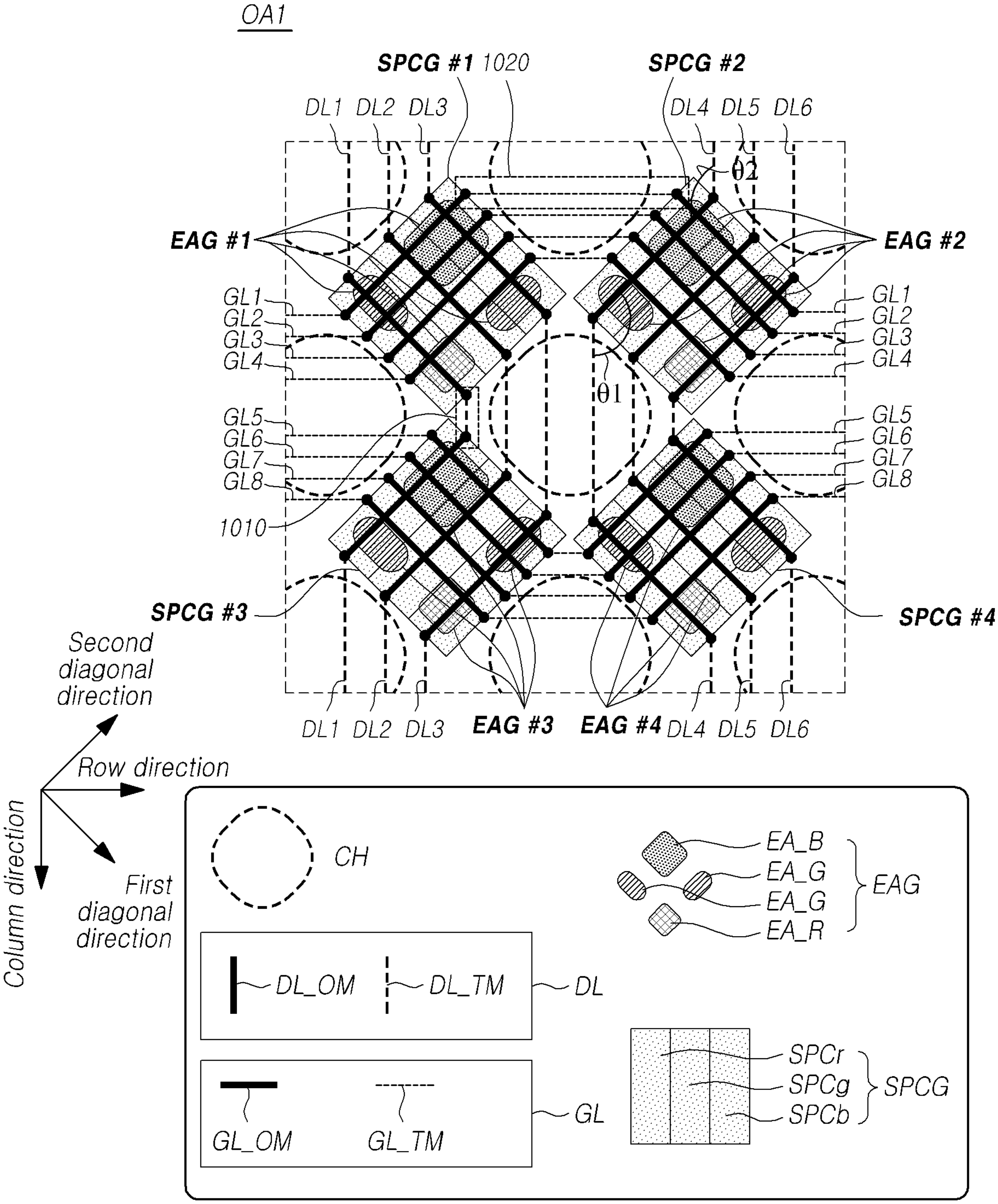
FIG. 10 illustrates an example planar structure of the first optical area of the display panel according to aspects of the present disclosure.

FIG. 10 illustrates an example planar structure of the first optical area OA1 of the display panel 110 according to aspects of the present disclosure.

The planar structure of FIG. 10 except for the arrangement of first type signal lines SL_TYPE1 and the arrangement of subpixel circuits (SPCr, SPCg, and SPCb) is substantially the same as the corresponding planar structure of FIG. 7. Thus, the foregoing discussions on the planar structure of FIG. 7 that are common to FIG. 10 except for the arrangement of first type signal lines SL_TYPE1 and the arrangement of subpixel circuits (SPCr, SPCg, and SPCb) are also applied to the planar structure of FIG. 10. Thus, discussions on the planar structure of FIG. 10 will be provided by focusing on features different from the planar structure of FIG. 7.

Referring to FIG. 10, respective three subpixel circuits (SPCr, SPCg, and SPCb) included in first, second, third, and fourth subpixel circuit groups (SPCG #1, SPCG #2, SPCG #3, and SPCG #4) disposed in the first optical area OA1 may be arranged in a diagonal direction having a predefined angle with respect to the row or column direction.

The three subpixel circuits (SPCr, SPCg, and SPCb) of the first subpixel circuit group SPCG #1 may be disposed in a first diagonal direction having a first angle with respect to the row or column direction.

The three subpixel circuits (SPCr, SPCg, and SPCb) of the second subpixel circuit group SPCG #2 may be disposed in a second diagonal direction having a second angle different from the first angle with respect to the row or column direction. The second diagonal direction may be a direction crossing the first diagonal direction. For example, the second diagonal direction may be perpendicular to the first diagonal direction.

The three subpixel circuits (SPCr, SPCg, and SPCb) of the third subpixel circuit group SPCG #3 may be disposed in the second diagonal direction.

The three subpixel circuits (SPCr, SPCg, and SPCb) of the fourth subpixel circuit group SPCG #4 may be disposed in the first diagonal direction.

Referring to FIG. 10, as the subpixel circuits (SPCr, SPCg, and SPCb) are arranged in the first or second diagonal direction having first or second angle with respect to the row or column direction, first to eighth gate lines (GL1 to GL8) may be arranged in a diagonal direction crossing a direction (e.g., the first or second diagonal direction) in which the subpixel circuits (SPCr, SPCg, and SPCb) are disposed.

Referring to FIG. 10, as the subpixel circuits SPCr, SPCg, and SPCb are arranged in the first or second diagonal direction having first or second angle with respect to the row or column direction, each of the first to eighth gate lines (GL1 to GL8) may have one or more bent or curved portions.

In one or more embodiments, each of the first, second, third, and fourth gate lines (GL1, GL2, GL3, and GL4) may include a first portion disposed in the row direction, a second portion disposed in the second diagonal direction, a third portion disposed in the row direction, a fourth portion disposed in the first diagonal direction, and a fifth portion disposed in the row direction.

The respective first, third, and fifth portions of the first, second, third, and fourth gate lines (GL1, GL2, GL3, and GL4) may be transparent gate line parts GL_TM, and the respective second and fourth portions thereof may be non-transparent gate line parts GL_OM.

In one or more embodiments, each of the fifth, sixth, seventh, and eighth gate lines (GL5, GL6, GL7, and GL8) may include a first portion disposed in the row direction, a second portion disposed in the first diagonal direction, a third portion disposed in the row direction, a fourth portion disposed in the second diagonal direction, and a fifth portion disposed in the row direction.

The respective first, third, and fifth portions of the fifth, sixth, seventh, and eighth gate lines (GL5, GL6, GL7, and GL8) may be transparent gate line parts GL_TM, and the respective second and fourth portions thereof may be non-transparent gate line parts GL_OM.

Referring to FIG. 10, as the subpixel circuits (SPCr, SPCg, and SPCb) are arranged in the first or second diagonal direction having first or second angle with respect to the row or column direction, each of first to sixth data lines (DL1 to DL6) may have one or more bent or curved portions.

Referring to FIG. 10, as the subpixel circuits (SPCr, SPCg, and SPCb) are arranged in the first or second diagonal direction having first or second angle with respect to the row or column direction, the first to sixth data lines (DL1 to DL6) may be arranged in a direction (e.g., the first or second diagonal direction) in which the subpixel circuits (SPCr, SPCg, and SPCb) are disposed.

In one or more embodiments, each of the first, second, and third data lines (DL1, DL2, and DL3) may include a first portion disposed in the column direction, a second portion disposed in the first diagonal direction, a third portion disposed in the column direction, a fourth portion disposed in the second diagonal direction, and a fifth portion disposed in the column direction.

The respective first, third, and fifth portions of the first, second, and third data lines (DL1, DL2, and DL3) may be transparent data line parts DL_TM, and the respective second and fourth portions thereof may be non-transparent data line parts DL_OM.

In one or more embodiments, each of the fourth, fifth, and sixth data lines (DL4, DL5, and DL6) may include a first portion disposed in the column direction, a second portion disposed in the second diagonal direction, a third portion disposed in the column direction, a fourth portion disposed in the first diagonal direction, and a fifth portion disposed in the column direction.

The respective first, third, and fifth portions of the fourth, fifth, and sixth data lines (DL4, DL5, and DL6) may be transparent data line parts DL_TM, and the respective second and fourth portions thereof may be non-transparent data line parts DL_OM.

As shown in FIG. 10, in one embodiment, a transparent data line part (e.g., DL_TM of DL4) extends in a first direction (e.g., column direction) at an area that overlaps the cathode hole CH. A non-transparent line part (e.g., DL_OM of DL4) that extends from the transparent data line part (e.g., DL_TM of DL4) runs in a second direction (e.g., second diagonal direction) at an area between adjacent cathode holes CH. The area between adjacent cathode holes CH includes areas where second light emitting area group EAG #2 are located. Other areas that are between adjacent cathode holes CH include the first light emitting area group EAG #1, the third light emitting area group EAG #3, the fourth light emitting area group EAG #4, or the like.

According to one embodiment, an angle θ1 between the first direction of the transparent line part (e.g., DL_TM of DL4) and the second direction of the non-transparent line part (e.g., DL_OM of DL4) is greater than 90 degrees and less than 180 degrees.

Similarly, an angle θ2 between the first direction of another transparent line part (e.g., DL_TM of DL4) and the second direction of the non-transparent line part (e.g., DL_OM of DL4) is greater than 90 degrees and less than 180 degrees.

Figure 11:
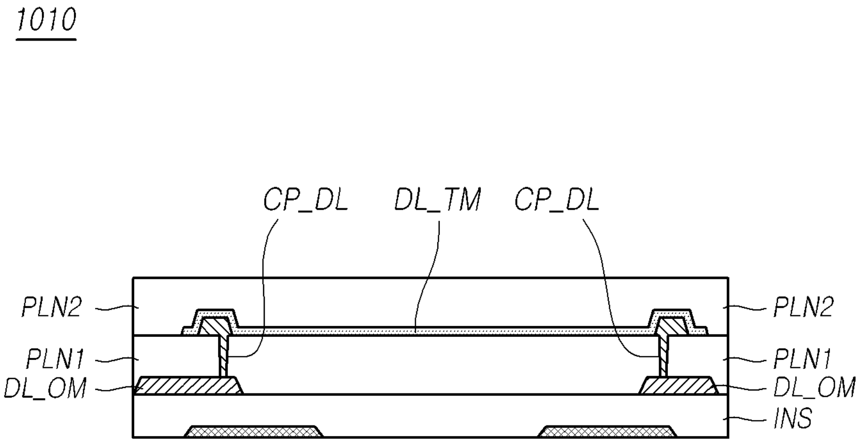
FIG. 11 illustrates an example stack structure of an area in a column direction in the configuration of FIG. 10.
Figure 12:
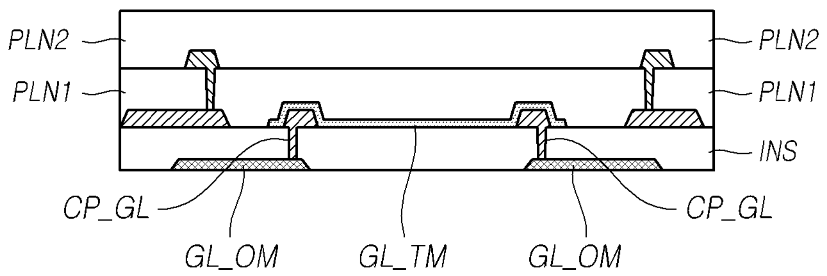
FIG. 12 illustrates an example stack structure of an area in a row direction in the configuration of FIG. 10.

FIG. 11 illustrates an example stack structure of an area in the column direction in the configuration of FIG. 10. FIG. 12 illustrates an example stack structure of an area in the row direction in the configuration of FIG. 10.

The stack structure of FIG. 11 represents a vertical structure of a portion 1010 of an area where the first data line DL1 is disposed in the configuration of FIG. 10. The stack structure of FIG. 12 represents a vertical structure of a portion 1020 of an area where the first gate line GL1 is disposed in the configuration of FIG. 10.

Referring to FIGS. 11 and 12, the display panel 110 may include, for example, an insulating layer INS, a first planarization layer PLN1, and a second planarization layer PLN2 over the substrate SUB. In this example, the insulating layer INS may include a plurality of layers configured with insulating property.

Referring to FIG. 11, the first data line DL1 may include, for example, at least one first transparent data line part DL_TM, and at least one first non-transparent data line part DL_OM. In one or more embodiments, both edges of the first transparent data line part DL_TM may be connected to one first non-transparent data line part DL_OM and another first non-transparent data line part DL_OM, respectively.

The at least one first transparent data line part DL_TM and the at least one first non-transparent data line part DL_OM of the first data line DL1 may be located in different layers.

The at least one first transparent data line part DL_TM of the first data line DL1 may be located between the first planarization layer PLN1 and the second planarization layer PLN2.

The at least one first non-transparent data line part DL_OM of the first data line DL1 may be located between the insulating layer INS and the first planarization layer PLN1.

In one or more embodiments, one edge of the first transparent data line part DL_TM of the first data line DL1 may be electrically connected to the one first non-transparent data line part DL_OM located under the first planarization layer PLN1 through one first data connection pattern CP_DL.

In one or more embodiments, the other edge of the first transparent data line part DL_TM of the first data line DL1 may be electrically connected to the another first non-transparent data line part DL_OM located under the first planarization layer PLN1 through another first data connection pattern CP_DL.

Each of the first data connection patterns CP_DL may be located on the first planarization layer PLN1 and be connected to the respective first non-transparent data line part DL_OM through a respective contact hole formed in the first planarization layer PLN1.

Each of both edges of the first transparent data line part DL_TM may be disposed on the first planarization layer PLN1 while contacting the upper surface and/or at least one side surface of the respective first data connection pattern CP_DL.

Referring to FIG. 12, the first gate line GL1 may include, for example, at least one first transparent gate line part GL_TM, and at least one first non-transparent gate line part GL_OM. In one or more embodiments, both edges of the first transparent gate line part GL_TM may be connected to one first non-transparent gate line part GL_OM and another first non-transparent gate line part GL_OM, respectively.

The at least one first transparent gate line part GL_TM and the at least one first non-transparent gate line part GL_OM of the first gate line GL1 may be located in different layers.

The at least one first transparent gate line part GL_TM of the first gate line GL1 may be located between the insulating layer INS and the first planarization layer PLN1.

The at least one first non-transparent gate line part GL_OM of the first gate line GL1 may be located under the insulating layer INS.

One edge of the first transparent gate line part GL_TM of the first gate line GL1 may be electrically connected to the one first non-transparent gate line part GL_OM located under the insulating layer INS through one first gate connection pattern CP_GL.

The other edge of the first transparent gate line part GL_TM of the first gate line GL1 may be electrically connected to the another first non-transparent gate line part GL_OM located under the insulating layer INS through another first gate connection pattern CP_GL.

Each of the first gate connection patterns CP_GL may be located on the insulating layer INS and be connected to the respective first non-transparent gate line part GL_OM through a respective contact hole formed in the insulating layer INS.

Each of both edges of the first transparent gate line part GL_TM may be disposed on the insulating layer INS while contacting the upper surface and/or at least one side surface of the respective first gate connection pattern CP_GL.

For example, referring to FIG. 11, the at least one first non-transparent data line part DL_OM of the first data line DL1 may include the first source-drain metal, and the at least one first transparent data line part DL_TM thereof may include the second transparent conductive material.

For example, referring to FIG. 11, in the first data line DL1, the at least one data connection pattern CP_DL may include the second source-drain metal.

For example, referring to FIG. 12, the at least one first non-transparent gate line part GL_OM of the first gate line GL1 may include the first gate metal, and the at least one first transparent gate line part GL_TM thereof may include the first transparent conductive material.

In one or more aspects, the display panel 110 may include, as conductive material layers, a first gate metal layer including the first gate metal, a first source-drain metal layer including the first source-drain metal, a first transparent conductive material layer including the first transparent conductive material, a second source-drain metal layer including the second source-drain metal, and a second transparent conductive material layer including the second transparent conductive material.

In the stack structures of FIGS. 8 and 9 based on the planar structure of FIG. 7, one or more data lines DL and one or more gate line GL may cross and overlap each other in an area outside of areas where the first to fourth subpixel circuit groups (SPCG #1 to SPCG #4) are disposed in the first optical area OA1.

In contrast, in the stack structures of FIGS. 11 and 12 based on the planar structure of FIG. 10, one or more data lines DL and one or more gate line GL may not cross and overlap each other in an area outside of areas where the first to fourth subpixel circuit groups (SPCG #1 to SPCG #4) are disposed in the first optical area OA1.

Figure 13:
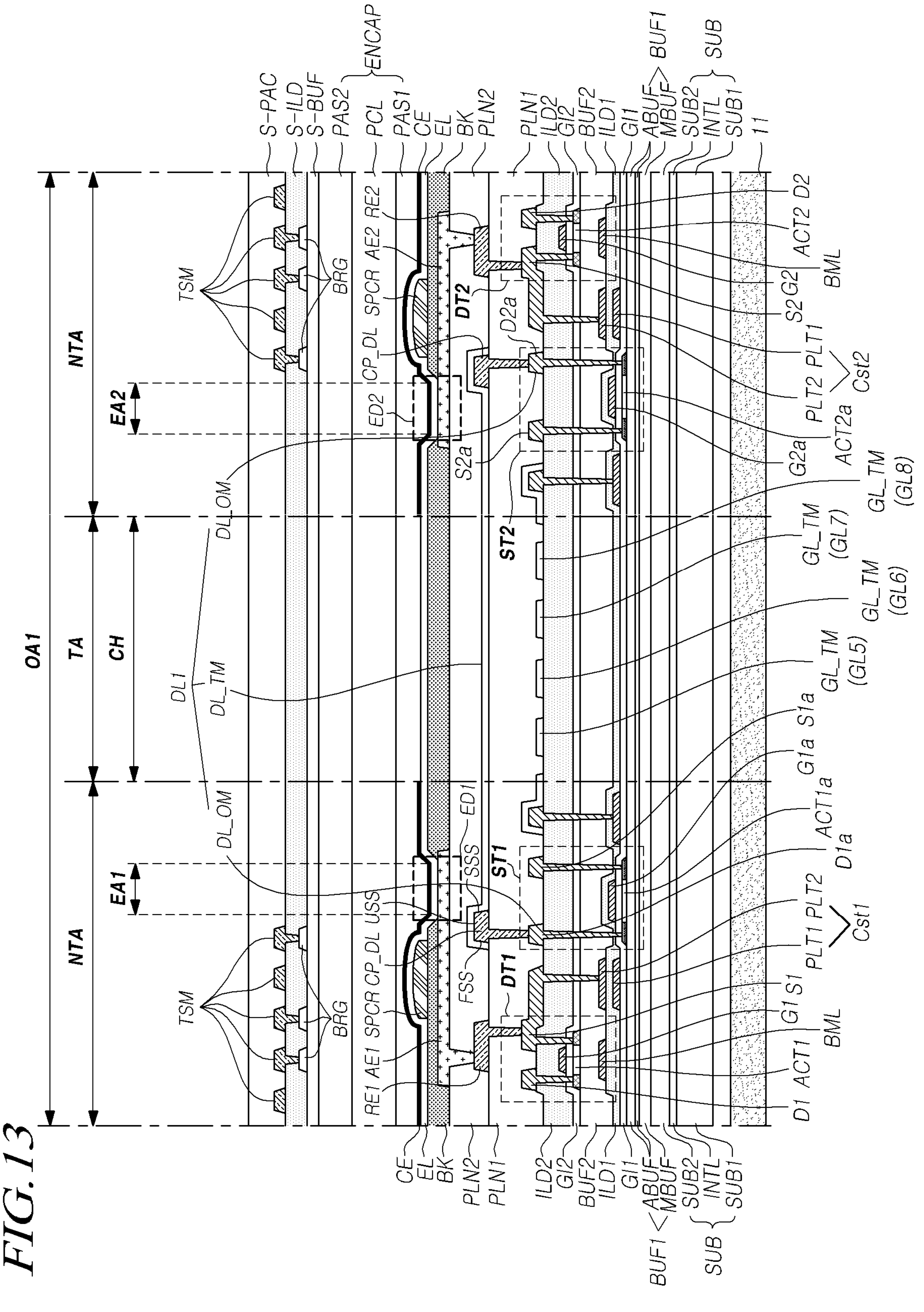
FIG. 13 is a cross-sectional view illustrating an example stack structure of the first optical area in which a first data line, which is a first type signal line, is disposed in the display panel according to aspects of the present disclosure.

FIG. 13 is a cross-sectional view illustrating an example stack structure of the first optical area OA1 in which a first data line (e.g., the first data line DL1 of the figures discussed above), which is a first type signal line (e.g., the first type signal line SL_TYPE1 of the figures discussed above), is disposed in the display panel 110 according to aspects of the present disclosure.

A portion of the first optical area OA1 shown in FIG. 13 may include a first light emitting area EA1 included in the first light emitting area group EAG #1 and a second light emitting area EA2 included in the third light emitting area group EAG #3 in FIG. 7.

A first light emitting element ED1 causing the first light emitting area EA1 to be formed and a second light emitting element ED2 causing the second light emitting area EA2 to be formed may be configured in the portion of the first optical area OA1 shown in FIG. 13. A first driving transistor DT1, a first scan transistor ST1, and a first storage capacitor Cst1 included in a subpixel circuit SPC for driving the first light emitting element ED1 may be configured in the portion of the first optical area OA1 shown in FIG. 13.

A second driving transistor DT2, a second scan transistor ST2, and a second storage capacitor Cst2 included in a subpixel circuit SPC for driving the second light emitting element ED2 may be configured in the portion of the first optical area OA1 shown in FIG. 13.

The first data line DL1 commonly connected with both of the drain electrode D1*a* of the first scan transistor ST1 and the drain electrode D2*a* of the second scan transistor ST2 may run across the portion of the first optical area OA1 shown in FIG. 13.

Referring to FIG. 13, in one or more aspects, in terms of stack structure, the display panel 110 may include a transistor forming part, a light emitting element forming part, and an encapsulation part and may further include a touch sensor.

To implement this configuration, in one or more embodiments, the display panel 110 may include a substrate SUB, a first buffer layer BUF1 on the substrate SUB, a first gate insulating layer GI1 on the first buffer layer BUF1, a first interlayer insulating layer ILD1 on the first gate insulating layer GI1, a second buffer layer BUF2 on the first interlayer insulating layer ILD1, a second gate insulating layer GI2 on the second buffer layer BUF2, a second interlayer insulating layer ILD2 on the second gate insulating layer GI2, a first planarization layer PLN1 on the second interlayer insulating layer ILD2, and a second planarization layer PLN2 on the first planarization layer PLN1.

In one or more embodiments, the display panel 110 may further include a first gate metal layer located between the first gate insulating layer GI1 and the first interlayer insulating layer ILD1, a first source-drain metal layer located between the second interlayer insulating layer ILD2 and the first planarization layer PLN1, a first transparent conductive material layer located between the first source-drain metal layer and the first planarization layer PLN1, a second source-drain metal layer located between the first planarization layer PLN1 and the second planarization layer PLN2, and a second transparent conductive material layer located between the second source-drain metal layer and the second planarization layer PLN2.

In one or more embodiments, the display panel 110 may further include a second gate metal layer between the first interlayer insulating layer ILD1 and the second buffer layer BUF2, and a third gate metal layer between the second gate insulating layer GI2 and the second interlayer insulating layer ILD2.

In one or more embodiments, the display panel 110 may further include a first active layer between the first buffer layer BUF1 and the first gate insulating layer GI1, and a second active layer between the second buffer layer BUF2 and the second gate insulating layer GI2.

Referring to FIG. 13, the transistor forming part may include the substrate SUB, the first buffer layer BUF1 on the substrate SUB, various types of transistors (DT1, ST1, DT2 and/or ST2) and one or more storage capacitors (Cst1 and/or Cst2) disposed on the first buffer layer BUF, and various electrodes and signal lines.

Referring to FIG. 13, the substrate SUB may include, for example, a first substrate SUB1 and a second substrate SUB2, and may include an intermediate layer INTL interposed between the first substrate SUB1 and the second substrate SUB2. In this example, the intermediate layer INTL may be an inorganic layer and may serve to prevent moisture permeation.

Referring to FIG. 13, the first buffer layer BUF1 may be a single layer or a multilayer. In an example where the first buffer layer BUF1 includes a stack of multilayer, the first buffer layer BUF1 may include a multi-buffer layer MBUF and an active buffer layer ABUF.

Various types of transistors (DT1, ST1, DT2, and/or ST2), one or more storage capacitors (Cst1 and/or Cst2), and various electrodes or signal lines may be disposed on the first buffer layer BUF1.

For example, the transistors (DT1, ST1, DT2, and/or ST2) disposed on the first buffer layer BUF1 may include a same material, and be located in one or more same layers.

In another example, as shown in FIG. 13, driving transistors (DT1 and DT2) and scan transistors (ST1 and ST2) may include different materials and be located in different layers.

Referring to FIG. 13, the first driving transistor DT1 and the first scan transistor ST1 may be included in the subpixel circuit SPC for driving the first light emitting element ED1 included in the first optical area OA1, and the second driving transistor DT2 and the second scan transistor ST2 may be included in the subpixel circuit SPC for driving the second light emitting element ED2 included in the first optical region OA1.

The first driving transistor DT1 may include an active layer ACT1, a gate electrode G1, a source electrode S1, and a drain electrode D1.

The first scan transistor ST1 may include an active layer ACT1*a*, a gate electrode G1*a*, a source electrode S1*a*, and a drain electrode D1*a*.

The active layer ACT1 of the first driving transistor DT1 may be disposed in a higher location than the active layer ACT1*a* of the first scan transistor ST1 in the stack structure. Considering the locations in the stack structure, the first driving transistor DT1 may be referred to as an upper transistor, and the first scan transistor ST1 may be referred to as a lower transistor.

That is, the upper transistor and the lower transistor may be distinct based on vertical locations in the stack structure of FIG. 13. In this point of view, the first driving transistor DT1 for driving the first light emitting element ED1 may be the upper transistor, and the first scan transistor ST1 for transmitting a data signal delivered through the first data line DL1 to the gate electrode G1 of the first driving transistor DT1 may be the lower transistor.

The source and drain electrodes (S1 and D1) of the first driving transistor DT1, which is the upper transistor, may be located in the first source-drain metal layer, and the gate electrode G1 of the first driving transistor DT1 may be located in the third gate metal layer disposed in a higher location than the first gate metal layer.

The source and drain electrodes (S1*a* and D1*a*) of the first scan transistor ST1, which is the lower transistor, may be located in the first source-drain metal layer, and the gate electrode G1*a* of the first scan transistor ST1 may be located in the first gate metal layer.

The first buffer layer BUF1 may be disposed under the active layer ACT1*a* of the first scan transistor ST1, and the second buffer layer BUF2 may be disposed under the active layer ACT1 of the first driving transistor DT1. That is, the active layer ACT1*a* of the first scan transistor ST1 may be disposed on the first buffer layer BUF1, and the active layer ACT1 of the first driving transistor DT1 may be disposed on the second buffer layer BUF2. In this case, the second buffer layer BUF2 may be located in a higher location than the first buffer layer BUF1.

The active layer ACT1*a* of the first scan transistor ST1 may be disposed on the first buffer layer BUF1, and the first gate insulating layer GI1 may be disposed on the active layer ACT1*a* of the first scan transistor ST1. The gate electrode G1*a* of the first scan transistor ST1 may be disposed on the first gate insulating layer GI1, and the first interlayer insulating layer ILD1 may be disposed on the gate electrode G1*a* of the first scan transistor ST1.

In one or more embodiments, the active layer ACT1*a* of the first scan transistor ST1 may include a channel region overlapping the gate electrode G1*a*, a source connection region located on one side of the channel region, and a drain connection region located on the other side of the channel region.

The second buffer layer BUF2 may be disposed on the first interlayer insulating layer ILD1.

The active layer ACT1 of the first driving transistor DT1 may be disposed on the second buffer layer BUF2, and the second gate insulating layer GI2 may be disposed on the active layer ACT1 of the first driving transistor DT1. The gate electrode G1 of the first driving transistor DT1 may be disposed on the second gate insulating layer GI2, and the second interlayer insulating layer ILD2 may be disposed on the gate electrode G1 of the first driving transistor DT1.

In one or more embodiments, the active layer ACT1 of the first driving transistor DT1 may include a channel region overlapping the gate electrode G1, a source connection region located on one side of the channel region, and a drain connection region located on the other side of the channel region.

The source and drain electrodes (S1 and D1) of the first driving transistor DT1 may be disposed on the second interlayer insulating layer ILD2. The source and drain electrodes (S1*a* and D1*a*) of the first scan transistor ST1 may be disposed on the second interlayer insulating layer ILD2.

The source and drain electrodes (S1*a* and D1*a*) of the first scan transistor ST1 may be respectively connected to the source connection region and the drain connection region of the active layer ACT1*a* through holes formed in the second interlayer insulating layer ILD2, the second gate insulating layer GI2, the second buffer layer BUF2, the first interlayer insulating layer ILD1, and the first gate insulating layer GI1.

The source and drain electrodes (S1 and D1) of the first driving transistor DT1 may be respectively connected to the source connection region and the drain connection region of the active layer ACT1 through holes formed in the second interlayer insulating layer ILD2 and the second gate insulating layer GI2.

The first storage capacitor Cst1 may include a first capacitor electrode PLT1 and a second capacitor electrode PLT2.

The first capacitor electrode PLT1 of the first storage capacitor Cst1 may be electrically connected to the gate electrode G1 of the first driving transistor DT1, and the second capacitor electrode PLT2 of the first storage capacitor Cst1 may be electrically connected to the source electrode S1 of the first driving transistor DT1.

The first capacitor electrode PLT1 of the first storage capacitor Cst1 may be located in the first gate metal layer. The second capacitor electrode PLT2 of the first storage capacitor Cst1 may be located in the second gate metal layer including a second gate metal.

In one or more embodiments, a lower metal BML may be disposed under the active layer ACT1 of the first driving transistor DT1. The lower metal BML may overlap all or at least a portion of the active layer ACT1 of the first driving transistor DT1. The lower metal BML may include the second gate metal included in the second gate metal layer.

For example, the lower metal BML may be electrically connected to the gate electrode G1 of the first driving transistor DT1. In another example, the lower metal BML may serve as a light shield configured to block light entering from a lower portion than the lower metal BML. For example, the lower metal BML may be electrically connected to the source electrode S1 of the first driving transistor DT1.

Referring to FIG. 13, the first planarization layer PLN1 may be disposed on the first driving transistor DT1 and the first scan transistor ST1. For example, the first planarization layer PLN1 is disposed on the source and drain electrodes (S1 and D1) of the first driving transistor DT1 and the source and drain electrodes (S1*a* and D1*a*) of the first scan transistor ST1.

Referring to FIG. 13, a first relay electrode RE1 may be disposed on the first planarization layer PLN1. The first relay electrode RE1 may represent an electrode for relaying an electrical connection between the source electrode S1 of the first driving transistor DT1 and a first anode electrode AE1 of the first light emitting element ED1.

The first relay electrode RE1 may include the second source-drain metal of the second source-drain metal layer on the first planarization layer PLN1. The first relay electrode RE1 may be electrically connected to the source electrode S1 of the first driving transistor DT1 through a hole formed in the first planarization layer PLN1.

Referring to FIG. 13, a first data connection pattern CP_DL may be disposed on the first planarization layer PLN1. The first data connection pattern CP_DL can electrically connect one edge of a transparent data line part DL_TM of the first data line DL1 to a non-transparent data line part DL_OM thereof.

Referring to FIG. 13, the first data connection pattern CP_DL may be, for example, electrically connected to the drain electrode D1*a* of the first scan transistor ST1 through a hole formed in the first planarization layer PLN1. In this example, the drain electrode D1*a* of the first scan transistor ST1 may include the non-transparent data line part DL_OM of the first data line DL1 or be electrically connected to the non-transparent data line part DL_OM of the first data line DL1.

As shown in FIG. 13, the first data connection pattern CP_DL has a first side surface FSS and a second side surface SSS opposite the first side surface. The first data connection pattern CP_DL also has an upper surface USS that is between the first side surface FSS and the second side surface SSS. Here, the first side surface FSS extends from the upper surface USS. Similarly, the second side surface SSS extends from the upper surface USS.

Referring to FIG. 13, one edge of the transparent data line part DL_TM of the first data line DL1 may, for example, be disposed on the first planarization layer PLN1 while contacting the upper surface and at least one side surface of the first data connection pattern CP_DL. In this example, a layer in which the transparent data line part DL_TM of the first data line DL1 is disposed may be the second transparent conductive material layer. In some embodiments, the transparent data line part DL_TM is disposed over the first data connection pattern CP_DL. For instance, the transparent data line part DL_TM covers and directly contacts the first side surface FSS, the upper surface USS, and the second side surface SSS.

The second driving transistor DT2, the second scan transistor ST2, and the second storage capacitor Cst2 may be disposed in the same manner as stackup configurations of the first driving transistor DT1, the first scan transistor ST1, and the first storage capacitor Cst1 as described above.

The second driving transistor DT2 may include an active layer ACT2, a gate electrode G2, a source electrode S2, and a drain electrode D2.

The second scan transistor ST2 may include an active layer ACT2*a*, a gate electrode G2*a*, a source electrode S2*a*, and a drain electrode D2*a*.

The active layer ACT2 of the second driving transistor DT2 may be disposed in a higher location than the active layer ACT2*a* of the second scan transistor ST2 in the stack structure. Considering the vertical locations in the stack structure, the second driving transistor DT2 may be referred to as an upper transistor, and the second scan transistor ST2 may be referred to as a lower transistor.

In this point of view, the second driving transistor DT2 for driving the second light emitting element ED2 may be the upper transistor, and the second scan transistor ST2 for transmitting a data signal delivered through the first data line DL1 to the gate electrode G2 of the second driving transistor DT2 may be the lower transistor.

The source and drain electrodes (S2 and D2) of the second driving transistor DT2, which is the upper transistor, may be located in the first source-drain metal layer, and the gate electrode G2 of the second driving transistor DT2 may be located in the third gate metal layer disposed in a higher location than the first gate metal layer.

The source and drain electrodes (S2*a* and D2*a*) of the second scan transistor ST2, which is the lower transistor, may be located in the first source-drain metal layer, and the gate electrode G2*a* of the second scan transistor ST2 may be located in the first gate metal layer.

Referring to FIG. 13, a second relay electrode RE2 may be disposed on the first planarization layer PLN1. The second relay electrode RE2 may represent an electrode for relaying an electrical connection between the source electrode S2 of the second driving transistor DT2 and a second anode electrode AE2 of the second light emitting element ED2.

The second relay electrode RE2 may be electrically connected to the source electrode S2 of the second driving transistor DT2 through a hole formed in the first planarization layer PLN1.

Referring to FIG. 13, another first data connection pattern CP_DL may be disposed on the first planarization layer PLN1. The another first data connection pattern CP_DL can electrically connect the other edge of the transparent data line part DL_TM of the first data line DL1 to another non-transparent data line part DL_OM thereof.

Referring to FIG. 13, the another first data connection pattern CP_DL may be, for example, electrically connected to the drain electrode D2*a* of the second scan transistor ST2 through a hole formed in the first planarization layer PLN1. In this example, the drain electrode D2*a* of the second scan transistor ST2 may include the non-transparent data line part DL_OM of the first data line DL1 or be electrically connected to the non-transparent data line part DL_OM of the first data line DL1.

Referring to FIG. 13, the other edge of the transparent data line part DL_TM of the first data line DL1 may, for example, be disposed on the first planarization layer PLN1 while contacting the upper surface and at least one side surface of the another first data connection pattern CP_DL. In this example, a layer in which the transparent data line part DL_TM of the first data line DL1 is disposed may be the second transparent conductive material layer.

As described above, the first data line DL1 can be configured with an electrical connection between the non-transparent data line parts DL_OM disposed in the first source-drain metal layer and the transparent data line part DL_TM disposed in the second transparent conductive material layer.

Referring to FIG. 13, the second planarization layer PLN2 may, for example, cover the first relay electrode RE1, the second relay electrode RE2, and the transparent data line part DL_TM. In this example, one edge of the transparent data line part DL_TM may be connected to the first data connection pattern CP_DL connected to the drain electrode D1*a* of the first scan transistor ST1, and the other edge of the transparent data line part DL_TM may be connected to the another first data connection pattern CP_DL connected to the drain electrode D2*a* of the second scan transistor ST2.

The active layers ACT1 and ACT2 of the first and second driving transistors DT1 and DT2, which are upper transistors, and the active layers ACT1*a* and ACT2*a* of the first and second scan transistors ST1 and ST2, which are lower transistors, may include different semiconductor materials from each other.

For example, the active layers ACT1 and ACT2 of the first and second driving transistors DT1 and DT2, which are upper transistors, may include an oxide semiconductor material. For example, such an oxide semiconductor material may include indium gallium zinc oxide (IGZO), indium gallium zinc tin oxide (IGZTO), zinc oxide (ZnO), cadmium oxide (CdO), indium oxide (InO), zinc tin oxide (ZTO), zinc indium tin oxide (ZITO), and the like.

The active layers ACT1*a* and ACT2*a* of the first and second scan transistors ST1 and ST2, which are lower transistors, may include different semiconductor materials from the active layers ACT1 and ACT2 of the first and second driving transistors DT1 and DT2, which are upper transistors.

For example, the active layers ACT1*a* and ACT2*a* of the first and second scan transistors ST1 and ST2, which are lower transistors, may include a silicon-based semiconductor material. For example, the silicon-based semiconductor material may include low-temperature polycrystalline silicon (LTPS) or the like.

Referring to FIG. 13, the light emitting element forming part may be located on the second planarization layer PNL2.

Referring to FIG. 13, the light emitting element forming part may include the first light emitting element ED1 and the second light emitting element ED2 disposed on the second planarization layer PNL2. The first light emitting element ED1 and the second light emitting element ED2 may be disposed in the first optical area OA1.

Although respective emission layers EL of the first light emitting element ED1 and the second light emitting element ED2 may be formed separately, for convenience of explanation, it is assumed that they are commonly formed as one common emission layer in FIG. 13. However, it should be understood that the scope of the present disclosure includes examples where respective emission layers EL of the first light emitting element ED1 and the second light emitting element ED2 are formed separately.

Referring to FIG. 13, the first light emitting element ED1 may be configured with a stackup configuration of the first anode electrode AE1, the emission layer EL, and the cathode electrode CE, which overlap one another. In other words, the first light emitting element ED1 may represent a portion of the first optical area OA1 in which the first anode electrode AE1, the emission layer EL, and the cathode electrode CE overlap one another. The second light emitting element ED2 may be configured with a stackup configuration of the second anode electrode AE2, the emission layer EL, and the cathode electrode CE, which overlap one another. In other words, the second light emitting element ED2 may represent a portion of the first optical area OA1 in which the second anode electrode AE2, the emission layer EL, and the cathode electrode CE overlap one another.

Referring to FIG. 13, the first anode electrode AE1 and the second anode electrode AE2 may be disposed on the second planarization layer PLN2.

The first anode electrode AE1 may be connected to the first relay electrode RE1 through a hole formed in the second planarization layer PLN2. The second anode electrode AE2 may be connected to the second relay electrode RE2 through another hole formed in the second planarization layer PLN2.

Referring to FIG. 13, a bank BK (also referred to as a bank layer BK) may be disposed on the first anode electrode AE1 and the second anode electrode AE2.

The bank BK may include a plurality of bank holes, and respective portions of the first anode electrode AE1 and the second anode electrode AE2 may be exposed through respective bank holes. That is, two bank holes of the plurality of bank holes formed in the bank BK may respectively overlap the respective portions of the first anode electrode AE1 and the second anode electrode AE2.

Referring to FIG. 13, the emission layer EL may be disposed on the bank BK. The emission layer EL may contact a portion of the first anode electrode AE1 through one of the bank holes, and contact a portion of the second anode electrode AE2 through another of the bank holes.

Referring to FIG. 13, at least one spacer SPCR may be present between the emission layer EL and the bank BK.

The bank BK may include one or more materials of an inorganic insulating material such as SiNx or SiOx and an organic insulating material such as benzocyclobutene (BCB), acryl resin, epoxy resin, phenolic resin, polyamide resin, or polyimide resin, but embodiments of the present disclosure are not limited thereto. As another example, the bank BK may include a black bank to which a black pigment is added, so as to reduce the reflection of light, but embodiments of the present disclosure are not limited thereto.

Referring to FIG. 13, the cathode electrode CE may be disposed on the emission layer EL. The cathode electrode CE may include a plurality of cathode holes CH. The plurality of cathode holes CH formed in the cathode electrode CE may be disposed in the first optical area OA1.

One cathode hole CH illustrated in FIG. 13 may represent a cathode hole located between the first light emitting area EA1 and the second light emitting area EA2.

Referring to FIG. 13, the encapsulation part may be located on the cathode electrode CE. The encapsulation part may include an encapsulation layer ENCAP disposed on the cathode electrode CE.

Referring to FIG. 13, the encapsulation layer ENCAP can serve to prevent penetration of moisture or oxygen into the light emitting elements (ED2, and ED2) disposed under the encapsulation layer ENCAP. In particular, the encapsulation layer ENCAP may include an organic material or film and can serve to prevent penetration of moisture or oxygen into the emission layer EL. In one or more embodiments, the encapsulation layer ENCAP may include a stack of a single layer or a stack of a multilayer.

Referring to FIG. 13, the encapsulation layer ENCAP may include a first encapsulation layer PAS1, a second encapsulation layer PCL, and a third encapsulation layer PAS2. First encapsulation layer PAS1 and the third encapsulation layer PAS2 may be, for example, inorganic material layers, and the second encapsulation layer PCL may be, for example, an organic material layer.

Since the second encapsulation layer PCL is implemented using an organic material, the second encapsulation layer PCL may serve as a planarization layer.

In one or more embodiments, a touch sensor may be embedded into the display panel 110 according to aspects of the present disclosure. In these embodiments, the display panel 110 according to aspects of the present disclosure may include a touch sensor part disposed on the encapsulation layer ENCAP.

Referring to FIG. 13, the touch sensor part may include touch sensor metals TSM and bridge metals BRG, and may further include one or more insulating layers such as a sensor buffer layer S-BUF, a sensor interlayer insulating layer S-ILD, a sensor protective layer S-PAC, and the like.

The sensor buffer layer S-BUF may be disposed on the encapsulation layer ENCAP. The bridge metals BRG may be disposed on the sensor buffer layer S-BUF, and the sensor interlayer insulating layer S-ILD may be disposed on the bridge metals BRG.

The touch sensor metals TSM may be disposed on the sensor interlayer insulating layer S-ILD. One or more of the touch sensor metals TSM may be connected to one or more respective bridge metals BRG of the bridge metals BRG through one or more respective holes formed in the sensor interlayer insulating layer S-ILD.

Referring to FIG. 13, the touch sensor metals TSM and the bridge metals BRG may be disposed in the normal area NA and may be disposed in the non-transmission area NTA of the first optical area OA1.

Referring to FIG. 13, the touch sensor metals TSM and the bridge metals BRG may be disposed in the non-transmission area NTA of the first optical area OA1 such that the touch sensor metals TSM and the bridge metals BRG do not overlap the first and second light emitting areas EA1 and EA2 disposed in the non-transmission area NTA.

A plurality of touch sensor metals TSM may be configured as one touch electrode (or one touch electrode line), and/or may be arranged in a mesh pattern and electrically connected to one another. One or more of the touch sensor metals TSM and one or more of the remaining touch sensor metals TSM may be electrically connected through one or more respective bridge metals BRG, and thereby, be configured as one touch electrode (or one touch electrode line).

The sensor protective layer S-PAC may be disposed such that it covers the touch sensor metals TSM and the bridge metals BRG.

In an embodiment where a touch sensor is embedded into the display panel 110, at least one of the touch sensor metals TSM, or at least a portion of at least one of the touch sensor metals TSM, located on the encapsulation layer ENCAP may extend along an inclined surface formed in an edge of the encapsulation layer ENCAP, and be electrically connected to a pad located in an edge of the display panel 110 that is further away from the inclined surface of the edge of the encapsulation layer ENCAP. The pad may be disposed in the non-display area NDA and may be a metal pattern to which the touch driving circuit 260 is electrically connected.

In one or more embodiments, referring to FIG. 13, the first light emitting area EA1 and the second light emitting area EA2 included in the first optical area OA1 may have the same area (light emitting area) or different areas (light emitting areas).

In one or more embodiments, referring to FIG. 13, respective transparent gate line parts GL_TM of fifth, sixth, seventh, and eighth gate lines (GL5, GL6, GL7, and GL8) intersecting the first data line DL1 may be disposed in the first transparent conductive material layer located between the first source-drain metal layer and the first planarization layer PLN1.

Figure 14:
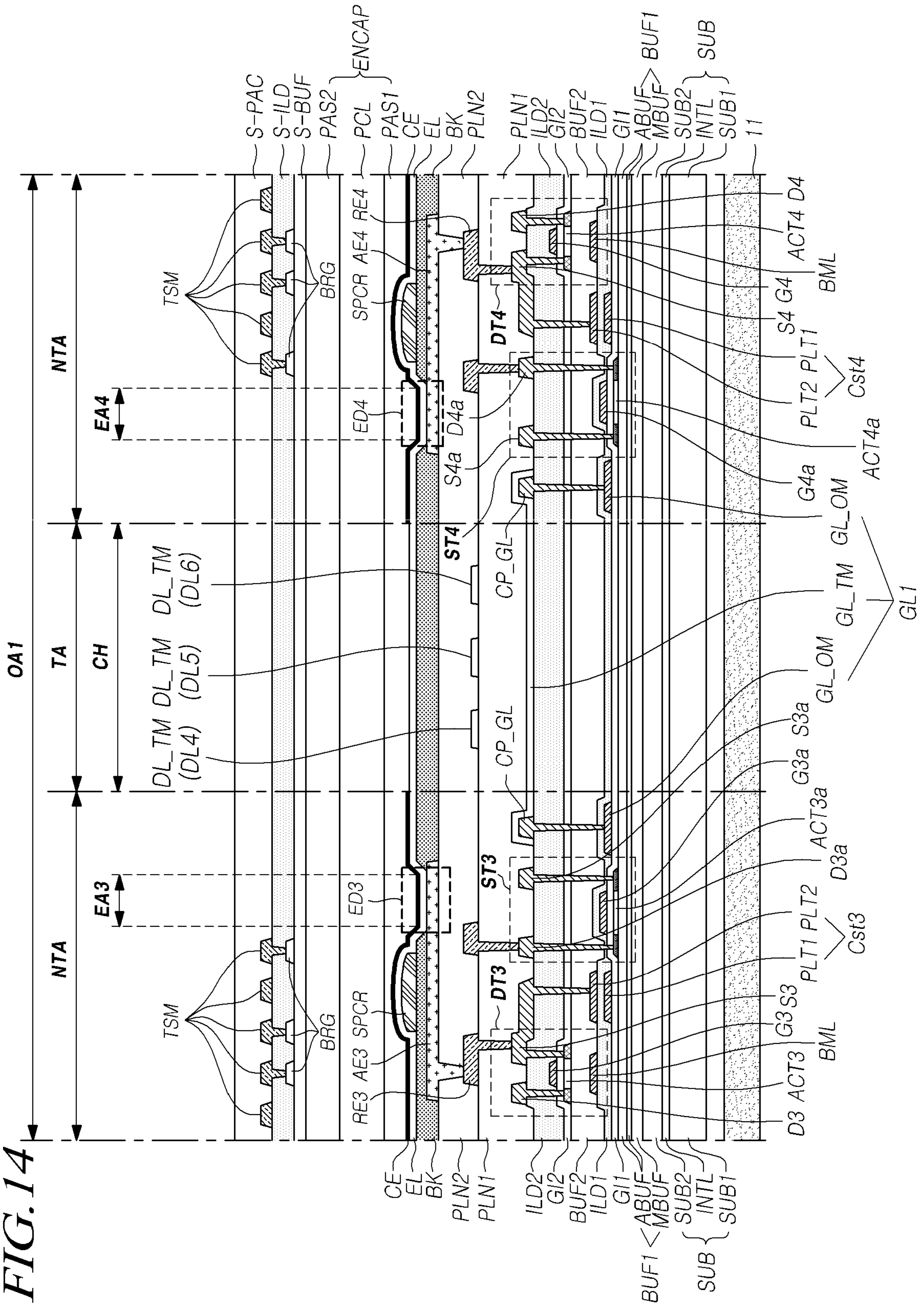
FIG. 14 is a cross-sectional view illustrating an example stack structure of the first optical area in which a first gate line, which is the first type signal line, is disposed in the display panel according to aspects of the present disclosure.

In these embodiments, the first source-drain metal layer may be a metal layer in which the source electrodes (S1, S1_a_, S2, and S2_a_) and the drain electrodes (D1, D1_a_, D2, and D2_a_) of the transistors (DT1, ST1, DT2, and ST2) are disposed FIG. 14 is a cross-sectional view illustrating an example stack structure of the first optical area OA1 in which a first gate line GL1, which is a first type signal line SL_TYPE1, is disposed in the display panel 110 according to aspects of the present disclosure.

Another portion of the first optical area OA1 shown in FIG. 14 may include a third light emitting area EA3 included in the first light emitting area group EAG #1 and a fourth light emitting area EA4 included in the second light emitting area group EAG #2 in FIG. 7.

A third light emitting element ED3 causing the third light emitting area EA3 to be formed and a fourth light emitting element ED4 causing the fourth light emitting area EA4 to be formed may be configured in the portion of the first optical area OA1 shown in FIG. 14.

A third driving transistor DT3, a third scan transistor ST3, and a third storage capacitor Cst3 included in a subpixel circuit SPC for driving the third light emitting element ED3 may be configured in the portion of the first optical area OA1 shown in FIG. 14.

A fourth driving transistor DT4, a fourth scan transistor ST4, and a fourth storage capacitor Cst4 included in a subpixel circuit SPC for driving the fourth light emitting element ED4 may be configured in the portion of the first optical area OA1 shown in FIG. 14.

The first gate line GL1 commonly connected with both of the gate electrode G3_a_ of the third scan transistor ST3 and the gate electrode G4_a_ of the fourth scan transistor ST4 may run across the portion of the first optical area OA1 shown in FIG. 14.

Referring to FIG. 14, the third light emitting element ED3 may represent a portion of the first optical area OA1 in which a third anode electrode AE3, an emission layer EL, and the cathode electrode CE overlap one another.

The third driving transistor DT3 may include an active layer ACT3, a gate electrode G3, a source electrode S3, and a drain electrode D3.

The source electrode S3 of the third driving transistor DT3 and the third anode electrode AE3 of the third light emitting element ED3 may be electrically connected through a third relay electrode RE3.

The third scan transistor ST3 may include an active layer ACT3_a_, a gate electrode G3_a_, a source electrode S3_a_, and a drain electrode D3_a_.

The third storage capacitor Cst3 may include a first capacitor electrode PLT1 and a second capacitor electrode PLT2.

Referring to FIG. 14, the fourth light emitting element ED4 may represent a portion of the first optical area OA1 in which a fourth anode electrode AE4, an emission layer EL, and the cathode electrode CE overlap one another.

The fourth driving transistor DT4 may include an active layer ACT4, a gate electrode G4, a source electrode S4, and a drain electrode D4.

The source electrode S4 of the fourth driving transistor DT4 and the fourth anode electrode AE4 of the fourth light emitting element ED4 may be electrically connected through a fourth relay electrode RE4.

The fourth scan transistor ST4 may include an active layer ACT4_a_, a gate electrode G4_a_, a source electrode S4_a_, and a drain electrode D4_a_.

The fourth storage capacitor Cst4 may include a first capacitor electrode PLT1 and a second capacitor electrode PLT2.

The third and fourth driving transistors DT3 and DT4 may be upper transistors, and the third and fourth scan transistors ST3 and ST4 may be lower transistors.

The stack structure of FIG. 14 except for the arrangement structure of the first gate line GL1 is substantially the same as the corresponding stack structure of FIG. 13. Thus, the foregoing discussions on the stack structure of FIG. 13 that are common to FIG. 14 except for the arrangement structure of the first gate line GL1 are also applied to the stack structure of FIG. 14. Thus, discussions on the stack structure of FIG. 14 will be provided by focusing on features different from the structure of FIG. 13.

Referring to FIG. 14, a non-transparent gate line part GL_OM of the first gate line GL1 may be electrically connected to the gate electrode G3_a_ of the third scan transistor ST3. Another non-transparent gate line part GL_OM of the first gate line GL1 may be electrically connected to the gate electrode G4*a* of the fourth scan transistor ST4.

Referring to FIG. 14, the non-transparent gate line parts GL_OM may be disposed in the first gate metal layer.

Referring to FIG. 14, the first gate metal layer may be a layer in which the gate electrode G3*a* of the third scan transistor ST3 and the gate electrode G4*a* of the fourth scan transistor ST4 are located, and be a layer in which the respective first capacitor electrodes PLT1 of the third storage capacitor Cst3 and the fourth storage capacitor Cst4 are located.

Referring to FIG. 14, the transparent gate line part GL_TM may be disposed in the first transparent conductive material layer between the first source-drain metal layer and the first planarization layer PLN1.

Referring to FIG. 14, one edge of the transparent gate line part GL_TM may be connected to one non-transparent gate line part GL_OM through a gate connection pattern CP_GL, and the other edge of the transparent gate line part GL_TM may be connected to another non-transparent gate line part GL_OM through another gate connection pattern CP_GL.

As described above, the first data line GL1 can be configured with an electrical connection between the non-transparent gate line parts GL_OM disposed in the first gate metal layer and the transparent gate line part GL_TM disposed in the first transparent conductive material layer.

In one or more embodiments, referring to FIG. 14, respective transparent data line parts DL_TM of fourth, fifth, and sixth data lines (DL4, DL5, and DL6) intersecting the first gate line GL1 may be disposed in the second transparent conductive material layer located between the first planarization layer PLN1 and the second planarization layer PLN2.

In one or more embodiments, referring to FIGS. 13 and 14, one or more bank holes formed in the bank BK may not overlap one or more cathode holes CH.

In one or more embodiments, referring to FIGS. 13 and 14, respective portions of the upper surface of the bank BK located under the cathode holes CH may be flat without being depressed or etched. For example, the bank BK may not be depressed or perforated at places where cathode holes CH are present. Thus, at places where cathode holes CH are present, the second planarization layer PLN2 and the first planarization layer PLN1 located in a lower location than the bank BK may not be depressed or perforated as well.

The flat state of the respective portions of the upper surface of the bank BK located under the cathode holes CH may mean that one or more insulating layers or one or more metal patterns (e.g., one or more electrode, one or more lines, and/or the like), or one or more emission layers EL located under the cathode electrode CE have not been damaged by the process of forming the cathode holes CH in the cathode electrode CE.

A brief description for the process of forming one or more cathode holes CH in the cathode electrode CE is as follows. A specific mask pattern may be deposited at one or more locations where one or more cathode holes CH are to be formed, and then, a cathode electrode material may be deposited thereon. Accordingly, the cathode electrode material may be deposited only in an area where the specific mask pattern is not located, and thereby, the cathode electrode CE including one or more cathode holes CH can be formed.

The specific mask pattern may include, for example, an organic material. The cathode electrode material may include a magnesium-silver (Mg—Ag) alloy.

In one or more embodiments, after the cathode electrode CE having the one or more cathode holes CH is formed, the display panel 110 may be in a situation in which the specific mask pattern is completely removed, partially removed (where a portion of the specific mask pattern remains), or not removed (where all of the specific mask pattern remains without being removed).

Referring to FIG. 13, the first light emitting area EA1 and the second light emitting area EA2 included in the first optical area OA1 may be formed in different bank holes.

The bank BK may include a first bank hole overlapping the first light emitting area EA1 and a second bank hole overlapping the second light emitting area EA2.

The cathode electrode CE may be disposed on the bank BK.

The first bank hole and the second bank hole of the bank BK may not overlap a cathode hole CH between the first bank hole and the second bank hole.

A portion of the upper surface of the bank BK located under the cathode hole CH between the first bank hole and the second bank hole of the bank BK may be flat without being depressed or etched.

Referring to FIG. 13, the first optical area OA1 may further include the first planarization layer PLN1 between the bank BK and a transparent line part (e.g., the first transparent data line part DL_TM).

A portion of the upper surface of the first planarization layer PLN1 located under the cathode hole CH between the first bank hole and the second bank hole of the bank BK may be flat.

Figure 15:
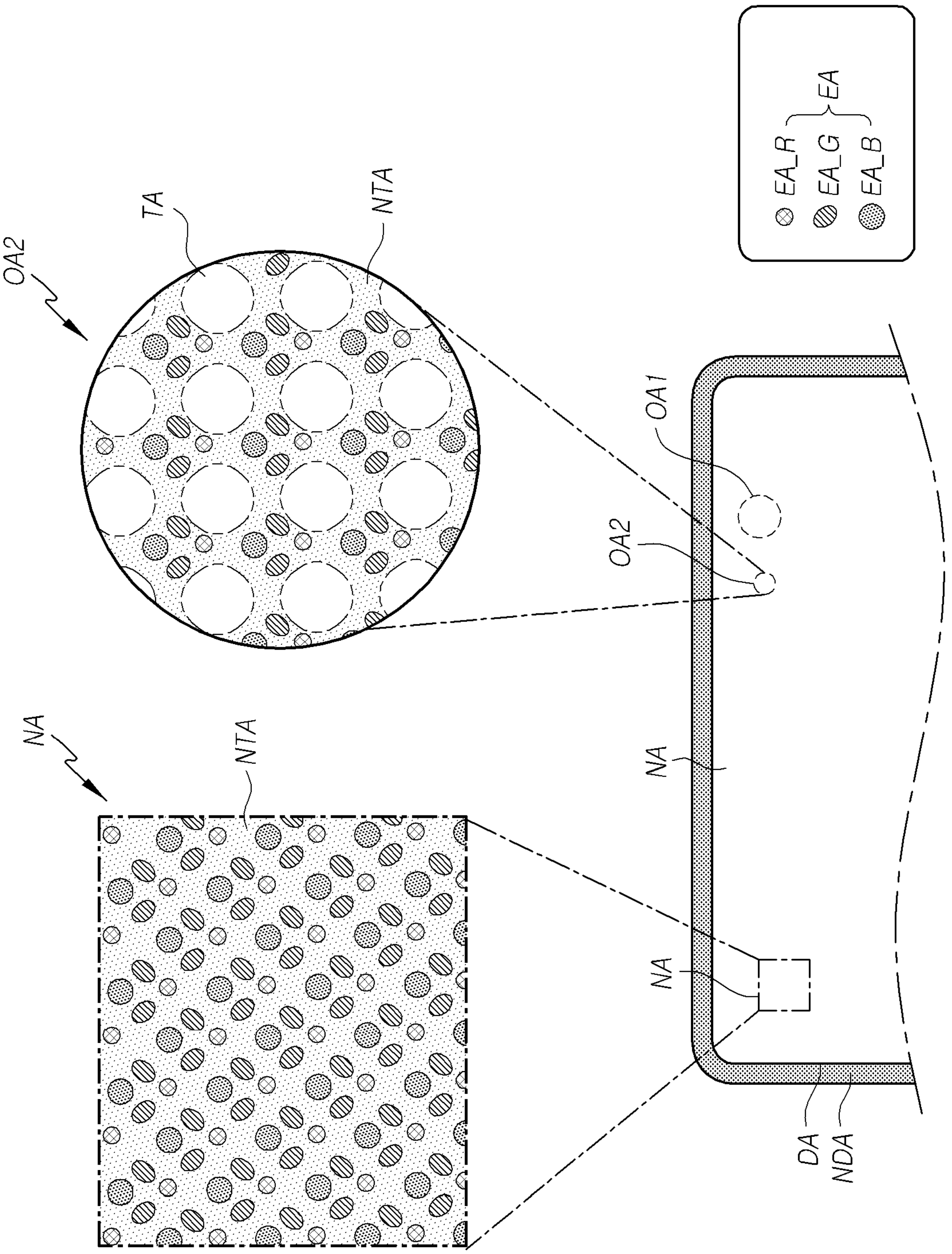
FIG. 15 illustrates an example normal area, and an example second optical area included in the display panel according to aspects of the present disclosure.

FIG. 15 illustrates an example normal area (e.g., the normal area NA in the figures discussed above), and an example second optical area (e.g., the second optical area OA2 in the figures discussed above) included in the display panel 110 according to aspects of the present disclosure.

Referring to FIG. 15, the display area DA of the display panel 110 may further include the second optical area OA2 in addition to the normal area NA and the first optical area OA1.

The first optical area OA1 may be an area overlapping the first optical electronic device 11, and the second optical area OA2 may be an area overlapping the second optical electronic device 12.

The first optical electronic device 11 and the second optical electronic device 12 may be configured to use, or to be operated by, different wavelengths of light from each other.

For example, one of the first optical electronic device 11 and the second optical electronic device 12 may be a camera using visible light, and the other thereof may be a sensor using light of a wavelength band different from visible light (e.g. infrared light or ultraviolet light).

For example, the first optical electronic device 11 may be a camera, and the second optical electronic device 12 may be an infrared sensor.

Referring to FIG. 15, the second optical area OA2 may include a non-transmission area NTA including a plurality of light emitting areas EA, and may further include at least one transmission area TA.

As shown in FIG. 15, the second optical area OA2 may be designed in substantially the same manner as the configuration of the first optical area OA1. However, it should be noted that the first optical area OA1 and the second optical area OA2 may differ from each other in at least one of a pattern in which subpixels are arranged, locations in which subpixels are disposed, the number of subpixels per unit area, emission areas of subpixels, transmittance, and the like.

The one or more embodiments described above will be briefly described as follows.

According to aspects of the present disclosure, a display device (e.g., the display device 100) can be provided that includes a display area allowing one or more images to be displayed therein and including a plurality of light emitting areas and a plurality of signal lines, and a non-display area in which an image is not displayed.

The display area may include a first optical area (e.g., the first optical area OA1) and a normal area (e.g., the normal area NA) the located outside of the first optical area.

The normal area may include a non-transmission area including a plurality of light emitting areas.

The first optical area may include a non-transmission area including a plurality of light emitting areas and may further include at least one transmission area.

The plurality of signal lines may include a plurality of first type signal lines running across the first optical area.

At least one of the plurality of first type signal lines may include at least one transparent line part disposed in the transmission area of the first optical area and at least one non-transparent line part disposed in the non-transmission area of the first optical area.

The transparent line part and the non-transparent line part may be located in different layers.

The display device may further include an insulating layer located between the transparent line part and the non-transparent line part, and a connection pattern for electrical connecting the transparent line part to the non-transparent line part through a hole formed in the insulating layer.

The at least one first type signal line may be bent or curved at a predefined angle or direction at a boundary (or an area around the boundary) between the transmission area and the non-transmission area included in the first optical area.

The plurality of first type signal lines may include at least one first gate line and at least one first data line.

The first gate line may include a first transparent gate line part disposed in the transmission area and a first non-transparent gate line part disposed in the non-transmission area.

The first transparent gate line part and the first non-transparent gate line part may be electrically connected to each other.

The first data line may include a first transparent data line part disposed in the transmission area and a first non-transparent data line part disposed in the non-transmission area.

The first transparent data line part and the first non-transparent data line part may be electrically connected to each other.

The first non-transparent gate line part may include a first gate metal.

The first transparent gate line part may include a first transparent conductive material.

The first non-transparent data line part may include a first source-drain metal.

The first transparent data line part may include a second transparent conductive material.

The plurality of first type signal lines may include another gate line different from the first gate line and another data line different from the first data line.

The another data line may include a transparent data line part overlapping the first transparent gate line part of the first gate line.

The another gate line may include a transparent gate line part overlapping the first transparent data line part of the first data line.

The plurality of signal lines may comprise a plurality of second type signal lines disposed only in the normal area without running across the first optical area.

Each of the plurality of second type signal lines may include a metal in at least one non-transparent line part included in the plurality of first type signal lines.

The display device may further include a first gate metal layer including the first gate metal, a first source-drain metal layer including the first source-drain metal, a first transparent conductive material layer including the first transparent conductive material, a second source-drain metal layer including a second source-drain metal, and a second transparent conductive material layer including a second transparent conductive material.

The display device may further include a substrate, a first buffer layer on the substrate, a first gate insulating layer on the first buffer layer, a first interlayer insulating layer on the first gate insulating layer, a second buffer layer on the first interlayer insulating layer, a second gate insulating layer on the second buffer layer, a second interlayer insulating layer on the second gate insulating layer, a first planarization layer on the second interlayer insulating layer, and a second planarization layer on the first planarization layer.

The first gate metal layer may be located between the first gate insulating layer and the first interlayer insulating layer. The first source-drain metal layer may be located between the second interlayer insulating layer and the first planarization layer. The first transparent conductive material layer may be located between the first source-drain metal layer and the first planarization layer. The second source-drain metal layer may be located between the first planarization layer and the second planarization layer. The second transparent conductive material layer may be located between the second source-drain metal layer and the second planarization layer.

The display device may further include a first gate connection pattern for electrically connecting the first transparent gate line part to the first non-transparent gate line part.

The first gate connection pattern may be disposed on the second interlayer insulating layer and may include the first source-drain metal.

The first gate connection pattern can electrically connect the first transparent gate line part to the first non-transparent gate line part through holes formed in the second interlayer insulating layer, the second gate insulating layer, the second buffer layer, and the first interlayer insulating layer.

The display device may further include a first data connection pattern for electrically connecting between the first transparent data line part and the first non-transparent data line part.

The first data connection pattern may be disposed on the first planarization layer and may include the second source-drain metal.

The first data connection pattern can electrically connect the first transparent data line part to the first non-transparent data line part through a hole formed in the first planarization layer.

The display device may further include an upper transistor disposed in the first optical area and including an upper active layer, and a lower transistor disposed in the first optical area and including a lower active layer.

The upper active layer may be disposed in a higher location than the lower active layer.

The source and drain electrodes of the upper transistor may be located in the first source-drain metal layer, and the gate electrode of the upper transistor may be disposed in another gate metal layer disposed in a higher location than the first gate metal layer.

The source and drain electrodes of the lower transistor may be located in the first source-drain metal layer, and the gate electrode of the lower transistor may be disposed in the first gate metal layer.

The display device may further include a first light emitting element disposed in the first optical area and configured with a stackup configuration of a first anode electrode, an emission layer, and a cathode electrode, which overlap one another.

The upper transistor may be a driving transistor for driving the first light emitting element, and the lower transistor may be a scan transistor for transmitting a data signal delivered through the first data line to the gate electrode of the driving transistor.

The display device may further include a lower metal disposed under the active layer of the upper transistor, overlapping the active layer of the upper transistor, and including the second gate metal.

The display device may further include a storage capacitor including a first capacitor electrode electrically connected to the gate electrode of the upper transistor and a second capacitor electrode electrically connected to the source electrode of the upper transistor.

The first capacitor electrode may be located in the first gate metal layer, and the second capacitor electrode may be located in the second gate metal layer including the second gate metal.

The display device may further include a first relay electrode for electrically connecting the source electrode of the upper transistor to a first anode electrode, and the first relay electrode may include the second source-drain metal.

The display device may further include a cathode electrode disposed in the first optical area and located on the plurality of first type signal lines.

The cathode electrode may include a plurality of cathode holes located in the first optical area.

Each of the plurality of cathode holes may overlap all or a portion of a transparent line part.

The display device may further include a first light emitting area and a second light emitting area included in the first optical area, and a bank including a first bank hole overlapping the first light emitting area, and a second bank hole overlapping the second light emitting area.

The cathode electrode may be disposed on the bank.

The first bank hole and the second bank hole may not overlap a cathode hole between the first bank hole and the second bank hole.

A portion of the upper surface of the bank BK located under the cathode hole between the first bank hole and the second bank hole of the bank BK may be flat without being depressed or etched.

The display device may further include a planarization layer between the bank and the transparent line part.

A portion of the upper surface of the planarization layer under the cathode hole between the first bank hole and the second bank hole may be flat.

The display device may further include an encapsulation layer on the cathode electrode and a touch sensor metal on the encapsulation layer.

The touch sensor metal may be disposed in the normal area and the non-transmission area of the first optical area.

The plurality of signal lines may further include a plurality of second type signal lines disposed only in the normal area without running across the first optical area.

Each of the plurality of second type signal lines may include a metal included in at least one non-transparent line part of at least one of the plurality of first type signal lines.

The display area may further include a second optical area (e.g., the second optical area OA2). The second optical area may include a non-transmission area including a plurality of light emitting areas and may further include at least one transmission area.

The display device may further include a first optical electronic device overlapping the first optical area and a second optical electronic device overlapping the second optical area.

For example, one of the first optical electronic device and the second optical electronic device may be a camera, and the other thereof may be a sensor different from the camera.

According to aspects of the present disclosure, a display panel (e.g., the display panel 110) can be provided that includes a display area allowing one or more images to be displayed therein and including a plurality of light emitting areas and a plurality of signal lines, a non-display area in which an image is not displayed, and a cathode electrode disposed to be overlapped with the display area.

The display area may include a first optical area (e.g., the first optical area OA1) and a normal area (e.g., the normal area NA) located outside of the first optical area.

The normal area may include a non-transmission area including a plurality of light emitting areas.

The first optical area may include a non-transmission area including a plurality of light emitting areas and may further include at least one transmission area.

The cathode electrode may include a plurality of cathode holes located in the first optical area.

At least one first type signal line running across the first optical area among the plurality of signal lines may include at least one non-transparent line part and at least one transparent line part.

All or a portion of the transparent line part may overlap at least one cathode hole of the cathode electrode.

All or a portion of the first optical area can be configured to allow one or more of visible light, infrared light, and ultraviolet light to be transmitted.

According to the embodiments described herein, a display panel (e.g., the display panel 110) and a display device (e.g., the display device 100) can be provided that include a light transmission structure for enabling one or more optical electronic devices to normally receive light (e.g., visible light, infrared light, ultraviolet light, or the like) while not being exposed in a front surface of the display device.

According to the embodiments described herein, a display panel (e.g., the display panel 110) and a display device (e.g., the display device 100) can be provided that include a signal line arrangement in at least optical area capable of improving the transmittance of the optical area by designing at least one signal line running across the optical area to have a transparent portion in at least one transmission area of the optical area.

According to the embodiments described herein, a display panel (e.g., the display panel 110) and a display device (e.g., the display device 100) can be provided that are capable of reducing the size of a non-transmission area in at least one optical area, further increasing the transmittance of the optical area, and thereby improving the performance of at least one optical electronic device (e.g., a camera, a sensor, and the like) overlapping the at least one optical area by disposing at least one signal line running across the optical area to overlap at least one transmission area of the optical area.

According to the embodiments described herein, a display panel (e.g., the display panel 110) and a display device (e.g., the display device 100) can be provided that are capable of providing high transmittance and high image quality in at least one optical area overlapping at least one optical electronic device within a display area.

Further example embodiments of the display device are provided below.

According to some embodiments, a display device includes a display panel including a substrate. Here, the substrate includes a display area having a first area and a second area located outside of the first area. The first area includes a light emitting area and a non-light emitting area adjacent to the light emitting area.

The display device includes a plurality of signal lines. At least one of the plurality of signal lines includes a transparent line part disposed in the non-light emitting area of the first area. The display device also includes an organic light emitting diode in the first area. The organic light emitting diode has a cathode, an anode, and an emission layer between the cathode and the anode. The display device includes a thin film transistor electrically connected to the organic light emitting diode. The thin film transistor has a gate electrode, a source electrode, and a drain electrode.

The display device further includes a first conductive material between the organic light emitting diode and the substrate. In some embodiments, the first conductive material overlaps with the anode of the organic light emitting diode at the non-light emitting area. In some embodiments, the transparent line part covers the first conductive material.

The display device may further include a second conductive material between the first conductive material and the substrate. Here, the second conductive material overlaps with the anode electrode of the organic light emitting diode.

In some embodiments, the second conductive material overlaps with the anode electrode of the organic light emitting diode and the first conductive material.

In some embodiments, wherein the first conductive material includes the same material as a material of either the source electrode or the drain electrode of the thin film transistor.

In some embodiments, the display device includes a capacitor (e.g., Cst1; see FIG. 13) having a first capacitor electrode PLT1 (see FIG. 13) and a second capacitor electrode PLT2 (see FIG. 13). Here, the first capacitor electrode includes the same material as the second conductive material.

In some embodiments, the transparent part line includes a first transparent line part and a second transparent line part. Here, the first transparent line part and the second transparent line part are disposed in a different layer from each other.

In some embodiments, the display device includes a planarization layer (e.g., PLN1; see FIG. 13) between the first transparent line part and the second transparent line part.

In some embodiments, the display device includes a bank layer defining the light emitting area of the organic light emitting diode and disposed adjacent to both sides of the organic light emitting diode. Here, the bank layer BK covers the anode electrode (e.g., AE1; see FIG. 13) of the organic light emitting diode.

In some embodiments, the bank layer includes a blank bank.

In some embodiments, the first conductive material (e.g., CP_DL; see FIG. 13) has a first side surface FSS, a second side surface SSS, and an upper surface USS between the first side surface FSS and the second side surface SSS. Here, the transparent line part (e.g., DL_TM; see FIG. 13) contacts the first side surface, the second side surface, and the upper surface of the first conductive material.

In some embodiments, the display device includes an encapsulation layer either on the first area or the second area and a touch sensor part on the encapsulation layer.

In some embodiments, the first area includes a transmission area and a non-transmission area adjacent to the transmission area, and the touch sensor part overlaps with the non-transmission part of the first area.

In some embodiments, the touch sensor part includes a touch sensor metal and a bridge metal. In some embodiments, the touch sensor part includes at least one insulating layer, and the at least one insulating layer is between the touch sensor metal and the bridge metal.

In some embodiments, the at least one insulating layer is between the organic light emitting diode and the substrate. Here, the substrate SUB includes a first substrate SUB1 and a second substrate SUB2, and an insulation layer INTL is between the first substrate SUB1 and the second substrate SUB2.

In some embodiments, the at least one insulating layer includes a first insulation layer between the substrate and the second conductive material.

In some embodiments, the at least one insulating layer includes a second insulation layer between the first conductive material and the second conductive material.

In some embodiments, the thin film transistor includes either an oxide semiconductor material or a silicon-based semiconductor material.

Additional features and aspects will be set forth in part in the description which follows and in part will become apparent from the description or may be learned by practice of the inventive concepts provided herein. Other features and aspects of the inventive concepts may be realized and attained by the structure particularly pointed out in, or derivable from, the written description, the claims hereof, and the appended drawings. Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims. It is to be understood that both the foregoing general description and the following detailed description of the present disclosure are exemplary and explanatory and are intended to provide further explanation of the inventive concepts as claimed.

The above description has been presented to enable any person skilled in the art to make and use the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

a first optical electronic device;

a display panel including a display area having a first area and a second area located outside of the first area, the first area overlapping with the first optical electronic device; and a plurality of signal lines including a plurality of first type signal lines and a plurality of second type signal lines, the plurality of first type signal lines extending across the first area and the plurality of second type signal lines disposed only in the second area without extending across the first area, a plurality of light emitting elements in the second area and the first area of the display area, each of the light emitting element of the plurality including an anode electrode, an emission layer, and a cathode electrode; and a cathode hole included in each of the cathode electrode in the first area;

wherein at least one of the plurality of first type signal lines includes a transparent line part disposed in a transmission area of the first area and a non-transparent line part disposed in a non-transmission area of the first area, wherein the transmission area of the first area is an area through which light can be transmitted between a front surface and rear surface of the display panel, wherein the transparent line part of the at least one of the plurality of first type signal lines overlaps the cathode hole in the first area, and wherein the transparent line part extends in a first direction at an area that overlaps the cathode hole in the first area and the non-transparent line part extends in a second direction at an area adjacent to cathode holes in the first area.

2. The display device of claim 1, comprising:

a connection pattern, wherein the transparent line part is located in a first conductive layer and the non-transparent line part is located in a second conductive layer different from the first conductive laver, and wherein the connection pattern electrically connects the transparent line part and the non-transparent line part.

3. The display device of claim 2, wherein the connection pattern is located adjacent to an edge of the cathode hole.

4. The display device of claim 1, wherein the non-transparent line part of the at least one of the plurality of first type signal lines overlaps an area between adjacent cathode holes in the first area.

5. The display device of claim 1, wherein the plurality of signal lines includes a plurality of data lines extending in a first direction and a plurality of gate lines extending a second direction transverse to the first direction, wherein at least one of the plurality of data lines includes at least one non-transparent data line part and at least one transparent data line part, wherein at least one of the plurality of gate lines includes at least one non-transparent gate line part and at least one transparent gate line part, wherein the at least one transparent data line part and the at least one transparent gate line part overlap the first area.

6. The display device of claim 5, wherein the at least one non-transparent data line part is located in a first source-drain metal layer and the at least one transparent gate line part is located in a first transparent conductive material layer different from the first source-drain metal layer.

7. The display device of claim 5, wherein the at least one transparent gate line part is located in a first transparent conductive material layer and the at least one transparent data line part is located in a second transparent conductive material layer different from the first transparent conductive material layer.

8. The display device of claim 1, wherein an angle between the first direction of the transparent line part and the second direction of the non-transparent line part is greater than 90 degrees and less than 180 degrees.

9. A display device comprising:

a display panel including a substrate, the substrate including a display area having a first area and a second area located outside of the first area, the first area including a non-transmission area and a transmission area adjacent to the non-transmission area;

a plurality of signal lines, wherein at least one of the plurality of signal lines includes a transparent line part disposed in the transmission area of the first area;

an organic light emitting diode in the first area, the organic light emitting diode having a cathode, an anode, and an emission layer between the cathode and the anode;

a thin film transistor electrically connected to the organic light emitting diode, the thin film transistor having a gate electrode, a source electrode, and a drain electrode; and a first conductive material between the organic light emitting diode and the substrate, wherein the anode of the organic light emitting diode is disposed in the non-transmission area, wherein the first conductive material overlaps with the anode of the organic light emitting diode at the non-transmission area, and wherein the transparent line part covers the first conductive material.

10. The display device of claim 9, comprising: a second conductive material between the first conductive material and the substrate, wherein the second conductive material overlaps with the anode electrode of the organic light emitting diode.

11. The display device of claim 10, wherein the second conductive material overlaps with the anode electrode of the organic light emitting diode and the first conductive material.

12. The display device of claim 9, wherein the first conductive material includes the same material as a material of either the source electrode or the drain electrode of the thin film transistor.

13. The display device of claim 10, comprising a capacitor having a first capacitor electrode and a second capacitor electrode, wherein the first capacitor electrode includes the same material as the second conductive material.

14. The display device of claim 9, wherein the transparent part line includes a first transparent line part and a second transparent line part, wherein the first transparent line part and the second transparent line part are disposed in a different layer from each other.

15. The display device of claim 14, comprising a planarization layer between the first transparent line part and the second transparent line part.

16. The display device of claim 9, comprising a bank layer defining the light emitting area of the organic light emitting diode and disposed adjacent to both sides of the organic light emitting diode, wherein the bank layer covers the anode electrode of the organic light emitting diode.

17. The display device of claim 16, wherein the bank layer includes a blank bank.

18. The display device of claim 9, wherein the first conductive material has a first side surface, a second side surface, and an upper surface between the first side surface and the second side surface, wherein the transparent line part contacts the first side surface, the second side surface, and the upper surface of the first conductive material.

19. The display device of claim 9, comprising:

an encapsulation layer either on the first area or the second area;

a touch sensor part on the encapsulation layer.

20. The display device of claim 19, wherein the first area includes a transmission area and a non-transmission area adjacent to the transmission area, wherein the touch sensor part overlaps with the non-transmission part of the first area.

21. The display device of claim 19, wherein the touch sensor part includes a touch sensor metal and a bridge metal.

22. The display device of claim 21, wherein the touch sensor part includes at least one insulating layer, and wherein the at least one insulating layer is between the touch sensor metal and the bridge metal.

23. The display device of claim 10, wherein the at least one insulating layer is between the organic light emitting diode and the substrate, wherein the substrate includes a first substrate and a second substrate, and wherein an insulation layer is between the first substrate and the second substrate.

24. The display device of claim 23, wherein the at least one insulating layer includes a first insulation layer between the substrate and the second conductive material.

25. The display device of claim 23, wherein the at least one insulating layer includes a second insulation layer between the first conductive material and the second conductive material.

26. The display device of claim 9, wherein the thin film transistor includes either an oxide semiconductor material or a silicon-based semiconductor material.

* * * * *